United States Patent
Nishimura et al.

(10) Patent No.: US 10,251,254 B2
(45) Date of Patent: Apr. 2, 2019

(54) EXTREME ULTRAVIOLET LIGHT GENERATING APPARATUS AND CONTROL METHOD FOR CENTROID OF EXTREME ULTRAVIOLET LIGHT

(71) Applicant: Gigaphoton Inc., Tochigi (JP)

(72) Inventors: Yuichi Nishimura, Oyama (JP); Takayuki Yabu, Oyama (JP)

(73) Assignee: Gigaphoton Inc., Tochigi (JP)

( * ) Notice: Subject to any disclaimer, the term of this patent is extended or adjusted under 35 U.S.C. 154(b) by 0 days.

(21) Appl. No.: 16/055,279

(22) Filed: Aug. 6, 2018

(65) Prior Publication Data
US 2018/0343729 A1  Nov. 29, 2018

Related U.S. Application Data

(63) Continuation of application No. PCT/JP2017/011516, filed on Mar. 22, 2017.

(30) Foreign Application Priority Data

Mar. 23, 2016  (WO) ................. PCT/JP2016/059236

(51) Int. Cl.
 *H05G 2/00* (2006.01)
 *H01S 3/00* (2006.01)
 (Continued)

(52) U.S. Cl.
 CPC ............ *H05G 2/008* (2013.01); *G01J 1/4209* (2013.01); *G01J 1/429* (2013.01); *G01J 1/4257* (2013.01);
 (Continued)

(58) Field of Classification Search
 CPC ........ G01J 1/4209; G01J 1/4259; G01J 1/429; G03F 7/70033; H01S 3/0071; H05G 2/008
 See application file for complete search history.

(56) References Cited

U.S. PATENT DOCUMENTS

| 8,598,552 B1 | 12/2013 | Frihauf et al. |
| 8,993,976 B2 | 3/2015 | Graham et al. |

(Continued)

FOREIGN PATENT DOCUMENTS

| JP | 2007-109451 A | 4/2007 |
| JP | 2014-531743 A | 11/2014 |
| JP | 2015-524599 A | 8/2015 |

OTHER PUBLICATIONS

International Search Report issued in corresponding International Application No. PCT/JP2016/059236; dated Jun. 14, 2016.

(Continued)

*Primary Examiner* — Mark R Gaworecki
(74) *Attorney, Agent, or Firm* — Studebaker & Brackett PC

(57) ABSTRACT

An extreme ultraviolet light generating apparatus includes: EUV light sensors configured to measure energy of extreme ultraviolet light from mutually different directions, the extreme ultraviolet light being generated by applying laser light to a target supplied to a predetermined region in a chamber; an application position adjusting unit configured to adjust an application position of the laser light to the target supplied to the predetermined region; and a controller configured to control the application position adjusting unit such that a centroid of the extreme ultraviolet light becomes a targeted centroid, the centroid of the extreme ultraviolet light being specified from measurement results of the EUV light sensors, the controller controlling the application position adjusting unit such that the application position is scanned in accordance with reference scan points mutually different in position, and calibrating the targeted centroid based on the measurement results acquired for the reference scan points.

25 Claims, 23 Drawing Sheets

(51) Int. Cl.
    *G01J 1/42*      (2006.01)
    *G03F 7/20*      (2006.01)
(52) U.S. Cl.
    CPC ........ *G03F 7/70033* (2013.01); *H01S 3/0071* (2013.01)

(56) References Cited

U.S. PATENT DOCUMENTS

| | | |
|---|---|---|
| 2013/0043401 A1 | 2/2013 | Graham et al. |
| 2015/0179401 A1 | 6/2015 | Gambino et al. |
| 2017/0122803 A1* | 5/2017 | Manger ................ G01J 1/4257 |

OTHER PUBLICATIONS

International Search Report issued in corresponding International Application No. PCT/JP2017/011516; dated Jul. 18, 2017.
International Preliminary Report on Patentability issued in corresponding International Application No. PCT/JP2016/059236; dated Sep. 25, 2018.
International Preliminary Report on Patentability issued in corresponding International Application No. PCT/JP2017/011516; dated Sep. 25, 2018.

* cited by examiner

Fig. 7

| EUV Cent.X [%] | | X | | | | | | |
|---|---|---|---|---|---|---|---|---|
| | | -x3 | -x2 | -x1 | 0 | x1 | x2 | x3 |
| Y | y3 | -4.3 | -5.1 | -5.2 | -4.4 | -3.7 | -4.6 | -10.0 |
| | y2 | -4.5 | -6.2 | -3.8 | -5.6 | -4.9 | -4.1 | -6.3 |
| | y1 | -3.0 | -7.4 | -4.2 | -1.6 | -1.6 | -4.5 | -5.8 |
| | 0 | -3.9 | -8.5 | -5.0 | -1.2 | 1.0 | 1.2 | -0.6 |
| | -y1 | -12.5 | -8.0 | -7.8 | -4.2 | -0.4 | 1.4 | 3.5 |
| | -y2 | N.D | -8.9 | -7.1 | -6.4 | -1.5 | 0.9 | 2.8 |
| | -y3 | N.D | N.D | N.D | -9.1 | -6.7 | -3.9 | 0.1 |

| EUV Cent.Y [%] | | X | | | | | | |
|---|---|---|---|---|---|---|---|---|
| | | -x3 | -x2 | -x1 | 0 | x1 | x2 | x3 |
| Y | y3 | 2.9 | 4.8 | 3.6 | 4.8 | 5.0 | 4.8 | 3.6 |
| | y2 | 2.3 | 1.0 | 2.3 | 2.4 | 4.1 | 5.4 | 5.7 |
| | y1 | 1.4 | -1.5 | -1.5 | 0.3 | 4.0 | 4.0 | 5.5 |
| | 0 | 0.0 | -4.1 | -4.1 | -2.1 | -2.0 | -0.8 | 4.3 |
| | -y1 | 0.2 | -4.0 | -7.2 | -6.5 | -4.9 | -4.3 | -1.6 |
| | -y2 | N.D | -1.2 | -5.9 | -8.4 | -8.2 | -6.2 | -3.9 |
| | -y3 | N.D | N.D | N.D | -5.6 | -7.7 | -8.2 | -7.1 |

| EUV Energy [mJ] | | X | | | | | | |
|---|---|---|---|---|---|---|---|---|
| | | -x3 | -x2 | -x1 | 0 | x1 | x2 | x3 |
| Y | y3 | | | | 4.9 | | | |
| | y2 | | | | 7.0 | | | |
| | y1 | | | | 9.9 | | | |
| | 0 | 2.1 | 6.6 | 9.6 | 9.9 | 9.8 | 8.9 | 0.5 |
| | -y1 | | | | 9.4 | | | |
| | -y2 | | | | 6.4 | | | |
| | -y3 | | | | 2.0 | | | |

| EUV Cent.X [%] | | X | | | | | | |
|---|---|---|---|---|---|---|---|---|
| | | -x3 | -x2 | -x1 | 0 | x1 | x2 | x3 |
| Y | y3 | | | | | | | |
| | y2 | | | | | | | |
| | y1 | | | | | | | |
| | 0 | -3.9 | -8.5 | -5.0 | 1.2 | 1.0 | 1.2 | 0.8 |
| | -y1 | | | | | | | |
| | -y2 | | | | | | | |
| | -y3 | | | | | | | |

A

| EUV Cent.Y [%] | X | | | | | | |
|---|---|---|---|---|---|---|---|
| | -x3 | -x2 | -x1 | 0 | x1 | x2 | x3 |
| Y  y3 | | | | 4.8 | | | |
| y2 | | | | 2.4 | | | |
| y1 | | | | 0.3 | | | |
| 0 | | | | -2.1 | | | |
| -y1 | | | | -6.5 | | | |
| -y2 | | | | -8.4 | | | |
| -y3 | | | | -5.6 | | | |

| EUV Cent.X [%] | | X | | | | | | |
|---|---|---|---|---|---|---|---|---|
| | | -x3 | -x2 | -x1 | 0 | x1 | x2 | x3 |
| Y | y3 | | | | | | | |
| | y2 | | | | | | | |
| | y1 | -3.0 | -7.4 | -4.2 | -1.6 | -1.6 | -4.5 | -5.8 |
| | 0 | | | | | | | |
| | -y1 | | | | | | | |
| | -y2 | | | | | | | |
| | -y3 | | | | | | | |

| EUV Cent.Y [%] | | X | | | | | | |
|---|---|---|---|---|---|---|---|---|
| | | -x3 | -x2 | -x1 | 0 | x1 | x2 | x3 |
| Y | y3 | | | 3.8 | | | | |
| | y2 | | | 2.3 | | | | |
| | y1 | | | -1.5 | | | | |
| | 0 | | | -4.1 | | | | |
| | -y1 | | | -7.2 | | | | |
| | -y2 | | | -5.9 | | | | |
| | -y3 | | | N.D | | | | |

B

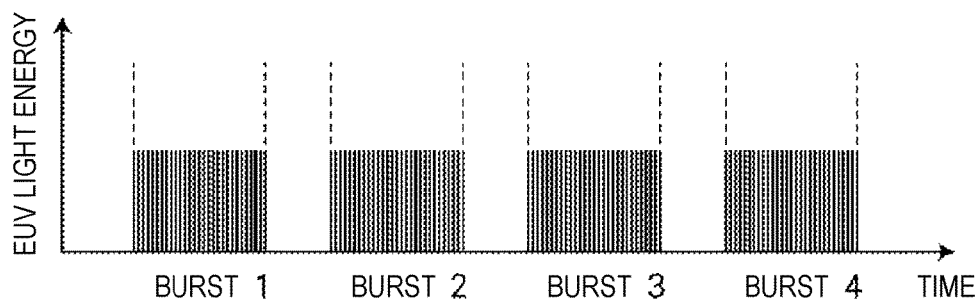

Fig. 24

| EUV Cent. X [%] | | X | | | | | | |
|---|---|---|---|---|---|---|---|---|
| | | -21 | -14 | -7 | 0 | 7 | 14 | 21 |
| Y | 21 | 1.6 | 0.2 | -1.9 | -1.8 | -0.1 | 1.3 | 3.7 |
| | 14 | -0.2 | -2.3 | -2.7 | -1.6 | -0.6 | 1.7 | 3.1 |
| | 7 | -2.1 | -3.5 | -2.0 | -0.3 | 1.0 | 1.5 | 2.8 |
| | 0 | -4.6 | -4.0 | -2.3 | -0.8 | 0.7 | 1.5 | 2.2 |
| | -7 | -5.0 | -3.6 | -2.3 | -1.0 | 0.7 | 1.1 | 1.7 |
| | -14 | -3.3 | -1.9 | 0.0 | 0.6 | 0.9 | 1.5 | 2.5 |
| | -21 | -1.8 | 0.1 | 1.0 | 1.2 | 1.4 | 1.8 | 2.7 |

| EUV Cent. Y [%] | | X | | | | | | |
|---|---|---|---|---|---|---|---|---|
| | | -21 | -14 | -7 | 0 | 7 | 14 | 21 |
| Y | 21 | 11.7 | 11.0 | 9.6 | 7.8 | 6.3 | 6.2 | 7.1 |
| | 14 | 11.2 | 10.3 | 9.9 | 8.5 | 6.0 | 5.7 | 5.9 |
| | 7 | 8.8 | 7.8 | 8.3 | 6.5 | 6.0 | 5.3 | 5.1 |
| | 0 | 5.7 | 5.9 | 6.5 | 5.3 | 4.1 | 3.3 | 4.0 |
| | -7 | 2.1 | 2.9 | 3.5 | 3.6 | 2.7 | 2.6 | 2.5 |
| | -14 | -0.8 | 0.1 | 1.0 | 1.1 | 1.8 | 2.0 | 2.5 |
| | -21 | -0.8 | 0.0 | 0.2 | 1.3 | 1.2 | 1.2 | 2.2 |

| EUV Energy3σ[%] | | X | | | | | | |
|---|---|---|---|---|---|---|---|---|
| | | -21 | -14 | -7 | 0 | 7 | 14 | 21 |
| Y | 21 | | | | 22.8 | | | |
| | 14 | | | | 15.7 | | | |
| | 7 | | | | 11.7 | | | |
| | 0 | 21.4 | 14.4 | 12.2 | 11.9 | 11.1 | 15.1 | 15.3 |
| | -7 | | | | 12.2 | | | |
| | -14 | | | | 12.6 | | | |
| | -21 | | | | 22.8 | | | |

| EUV Cent. X [%] | | X | | | | | | |
|---|---|---|---|---|---|---|---|---|
| | | -21 | -14 | -7 | 0 | 7 | 14 | 21 |
| Y | 21 | | | | | | | |
| | 14 | | | | | | | |
| | 7 | | | | | | | |
| | 0 | -4.6 | -4.0 | -2.3 | -0.8 | 0.7 | 1.5 | 2.2 |
| | -7 | | | | | | | |
| | -14 | | | | | | | |
| | -21 | | | | | | | |

A

EXTREME ULTRAVIOLET LIGHT GENERATING APPARATUS AND CONTROL METHOD FOR CENTROID OF EXTREME ULTRAVIOLET LIGHT

CROSS-REFERENCE TO RELATED APPLICATIONS

The present application is a continuation application of International Application No. PCT/JP2017/011516 filed on Mar. 22, 2017 claiming the priority to International Application No. PCT/JP2016/059236 filed on Mar. 23, 2016. The contents of the applications are incorporated herein by reference in its entirety.

BACKGROUND

1. Technical Field

The present disclosure relates to an extreme ultraviolet light generating apparatus and a control method for a centroid of extreme ultraviolet light.

2. Related Art

In recent years, with the miniaturization of semiconductor process, the miniaturization of the transcription pattern in optical lithography of the semiconductor process has rapidly progressed. In the next generation, fine processing of 20 nm or less will be demanded. Therefore, it is expected to develop an exposure apparatus in which an extreme ultraviolet (EUV) light generating apparatus to generate extreme ultraviolet (EUV) light with a wavelength of about 13 nm and a reduced projection reflective optical system are combined.

As the EUV light generating apparatus, there have been proposed three types of apparatuses: an LPP (Laser Produced Plasma) type apparatus using plasma that is generated by applying laser light to a target; a DDP (Discharge Produced Plasma) type apparatus using plasma that is generated by discharge, and an SR (Synchrotron Radiation) type apparatus using orbital radiation.

LIST OF DOCUMENTS

Patent Document

Patent Document 1: U.S. Pat. No. 8,598,552
Patent Document 2: U.S. Pat. No. 8,993,976

SUMMARY

An extreme ultraviolet light generating apparatus according to one aspect of the present disclosure may include a plurality of EUV light sensors, an application position adjusting unit, and a controller. The EUV light sensors may be configured to measure energy of extreme ultraviolet light from mutually different directions, the extreme ultraviolet light being generated by applying laser light to a target supplied to a predetermined region in a chamber. The application position adjusting unit may be configured to adjust an application position of the laser light to the target supplied to the predetermined region. The controller may be configured to control the application position adjusting unit such that a centroid of the extreme ultraviolet light becomes a targeted centroid, the centroid of the extreme ultraviolet light being specified from measurement results of the EUV light sensors. The controller may control the application position adjusting unit such that the application position is scanned in accordance with a plurality of reference scan points that are mutually different in position, and may calibrate the targeted centroid based on the measurement results acquired for the reference scan points.

A control method for a centroid of extreme violet light according to another aspect of the present disclosure may be a method for controlling a centroid of extreme ultraviolet light that is generated by applying laser light to a target, and may include a first step, a second step, and a third step. The first step may be a step of scanning an application position of the laser light to the target in accordance with a plurality of reference scan points that are mutually different in position, and acquiring energy of the extreme ultraviolet light for the reference scan points. The second step may be a step of specifying evaluated values of the centroid for the reference scan points, from the energy acquired in the first step. The third step may be a step of calibrating a targeted centroid of the centroid, based on at least one of the energy acquired in the first step and the evaluated values specified in the second step.

BRIEF DESCRIPTION OF THE DRAWINGS

Some embodiments of the present disclosure, as just examples, will be described below, with reference to the accompanying drawings.

FIG. 7 shows an exemplary distribution map of evaluated values of an X-axis coordinate component of the centroid of the EUV light that is created in step S7 of FIG. 4;

FIG. 8 shows an exemplary distribution map of evaluated values of a Y-axis coordinate component of the centroid of the EUV light that is created in step S7 of FIG. 4;

FIG. 9 shows a plurality of reference scan points that are arrayed along an X-axis and a Y-axis with respect to a reference scan point A shown in FIG. 6 and measurement results of the EUV light sensors that are stored in association with the reference scan points;

FIG. 10 shows a plurality of reference scan points that are arrayed along the X-axis with respect to the reference scan point A shown in FIG. 6 and evaluated values of the X-axis coordinate component of the centroid of the EUV light that are stored in association with the reference scan points;

FIG. 15 shows a plurality of reference scan points that are arrayed along the X-axis with respect to the reference scan point B shown in FIG. 6 and evaluated values of the X-axis coordinate component of the centroid of the EUV light that are stored in association with the reference scan points;

FIG. 16 shows a plurality of reference scan points that are arrayed along the Y-axis with respect to the reference scan point B shown in FIG. 6 and evaluated values of the Y-axis coordinate component of the centroid of the EUV light that are stored in association with the reference scan points;

FIG. 22 shows a diagram for describing a burst light emission of the EUV light that is performed in a fifth embodiment;

FIG. 23 shows a distribution map of variation indexes of the EUV light energy that is measured in the fifth embodiment;

FIG. 24 shows an exemplary distribution map of evaluated values of the X-axis coordinate component of the centroid of the EUV light that is measured in the fifth embodiment;

FIG. 25 shows an exemplary distribution map of evaluated values of the Y-axis coordinate component of the centroid of the EUV light that is measured in the fifth embodiment;

FIG. 26 shows a plurality of reference scan points that are arrayed along the X-axis and the Y-axis with respect to a reference scan point A shown in FIG. 23 and variation indexes of the EUV light energy that are stored in association with the reference scan points;

FIG. 27 shows a plurality of reference scan points that are arrayed along the X-axis with respect to the reference scan point A shown in FIG. 23 and evaluated values of the X-axis coordinate component of the centroid of the EUV light that are stored in association with the reference scan points;

DESCRIPTION OF EMBODIMENTS

Figure 1:
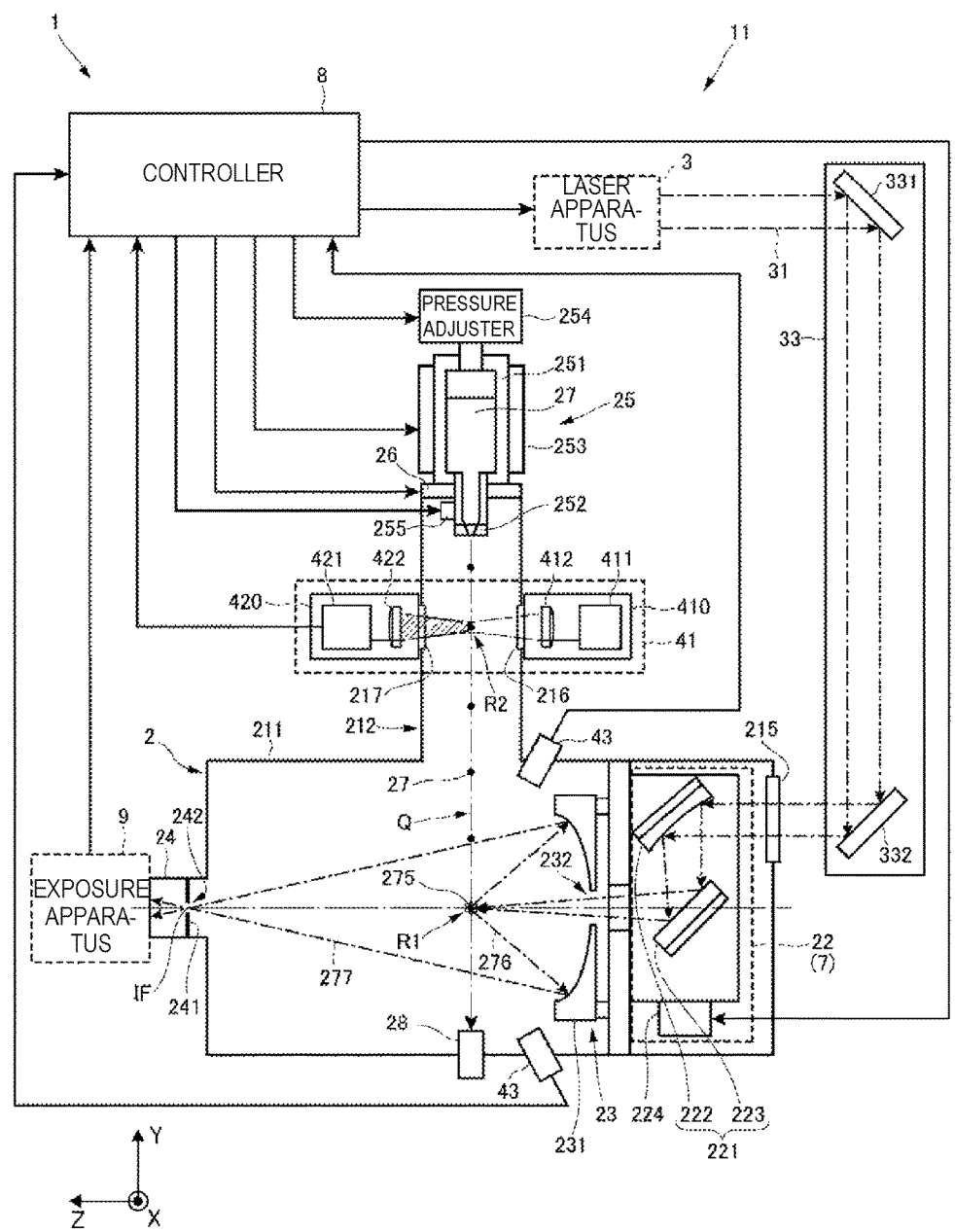
FIG. 1 shows a diagram for describing the configuration of an EUV light generating apparatus of a comparative example.

<Contents>
1. Terms
2. Problem
   2.1 Configuration of Comparative Example
   2.2 Operation of Comparative Example
   2.3 EUV Light Sensor and EUV Light Centroid Control
   2.4 Problem
3. First Embodiment
   3.1 Configuration
   3.2 Operation
   3.3 Determination of Targeted Centroid
   3.4 Effect
4. Second Embodiment
5. Third Embodiment
   5.1 Configuration
   5.2 Operation
   5.3 Effect
6. Fourth Embodiment
7. Fifth Embodiment
   7.1 Configuration
   7.2 Operation
   7.3 Effect
8. Sixth Embodiment
9. Seventh Embodiment
10. Others Hereinafter, embodiments of the present disclosure will be described in detail, with reference to the drawings. The embodiments described below show some examples of the present disclosure, and do not limit the content of the present disclosure. Further, not all of the configurations and operations described in the embodiments are necessarily essential as the configuration and operation of the present disclosure. Identical elements are denoted by identical reference symbols, and repetitive descriptions are omitted.

1. Terms

"Target" is an object to be irradiated with laser light that is introduced into a chamber. The target to which the laser light has been applied generates plasma to radiate the light including EUV light.

"Plasma generation region" is a predetermined region in the chamber. The plasma generation region is a region where the laser light is applied to the target put into the chamber and the target generates plasma.

"Target trajectory" is a path through which the target put into the chamber travels. The target trajectory crosses the optical path of the laser light introduced into the chamber, in the plasma generation region.

"Optical path axis" is an axis that passes through the center of a beam cross-section of the laser light along the traveling direction of the laser light.

"Optical path" is a path along which the laser light passes. The optical path contains the optical path axis.

"Z-axis direction" is the traveling direction of the laser light when the laser light introduced into the chamber travels toward the plasma generation region. The Z-axis direction may be roughly the same as a direction in which the EUV light generating apparatus outputs the EUV light.

"Y-axis direction" is a direction opposite to a direction in which a target supply device outputs the target to the chamber. The Y-axis direction is a direction perpendicular to the X-axis direction and the Z-axis direction.

"X-axis direction" is a direction perpendicular to the Y-axis direction and the Z-axis direction.

"Burst light emission" by the EUV light generating apparatus is to repeatedly emit the EUV light at a relatively high frequency in a predetermined period. The above predetermined period is also called "burst light emission period". Typically, the burst light emission period is set so as to be repeated with a predetermined stop period. That is, in each burst light emission period, a set of EUV light that is emitted in pulses at a high frequency is output.

"Reference scan point" means one of a plurality of scan positions different from each other at the time of the scanning with the laser light in an application position of the laser light to the target.

2. Problem

An EUV light generating apparatus 1 of a comparative example will be described with use of FIG. 1 to FIG. 3.

The EUV light generating apparatus 1 of the comparative example is an LPP type EUV light generating apparatus. The EUV light generating apparatus 1 is used together with at least one laser apparatus 3.

A system including the EUV light generating apparatus 1 and the laser apparatus 3 is also referred to as an EUV light generating system 11.

The EUV light generating apparatus 1 generates a plasma 275 of a target 27, by applying, to the target 27, at least one pulsed laser light beam 31 output from the laser apparatus 3. The generated plasma 275 radiates radiation light 276. In addition to the EUV light 277, the radiation light 276 includes light beams having various wavelengths. The EUV light generating apparatus 1 captures the EUV light 277 included in the radiation light 276, and outputs the EUV light 277 to an exposure apparatus 9.

In this way, the EUV light generating apparatus 1 can generate the EUV light 277.

[2.1 Configuration of Comparative Example]

FIG. 1 is a diagram for describing the configuration of the EUV light generating apparatus 1 of the comparative example.

The EUV light generating apparatus 1 of the comparative example includes a chamber 2, a laser light focusing optical system 22, an EUV light focusing optical system 23, a connection part 24, and a laser light delivery optical system 33. In addition, the EUV light generating apparatus 1 of the comparative example includes a target supply device 25, a stage 26, a target collector 28, a target detecting sensor 41, an EUV light sensor 43, and a controller 8.

The chamber 2 is a container in which pulsed laser light 31 is applied to the target 27 supplied to the interior so that the plasma 275 is generated from the target 27 and the EUV light 277 is generated.

A wall 211 of the chamber 2 forms the internal space of the chamber 2, and separates the internal space of the chamber 2 from the exterior. The wall 211 is provided with a window 215 for introducing the pulsed laser light 31 into the chamber 2.

The chamber 2 contains a target supply channel 212 for supplying the target 27 into the chamber 2.

The laser light delivery optical system 33 introduces the pulsed laser light 31 output from the laser apparatus 3, into the chamber 2 through the window 215.

The laser light delivery optical system 33 is disposed in the exterior of the chamber 2. The laser light delivery optical system 33 is disposed on the optical path of the pulsed laser light 31 output from the laser apparatus 3, between the laser apparatus 3 and the window 215.

The laser light delivery optical system 33 includes a high reflectance mirror 331 and a high reflectance mirror 332.

Each of the high reflectance mirrors 331, 332 is mounted on an unillustrated stage that adjusts at least one of the position and the attitude. The operation of the stages on which the high reflectance mirrors 331, 332 are mounted is controlled by the controller 8.

The laser light focusing optical system 22 focuses the pulsed laser light 31 introduced into the chamber 2 through the window 215, on a plasma generation region R1.

The laser light focusing optical system 22 is disposed in the interior of the chamber 2. The laser light focusing optical system 22 is disposed on the optical path of the pulsed laser light 31 having passed through the window 215, between the window 215 and the plasma generation region R1.

The laser light focusing optical system 22 includes a laser light focusing mirror 221 and a manipulator 224.

The laser light focusing mirror 221 reflects the pulsed laser light 31 having passed through the window 215, toward the plasma generation region R1. The laser light focusing mirror 221 focuses the reflected pulsed laser light 31 on the plasma generation region R1.

The laser light focusing mirror 221 is mounted on the manipulator 224.

The laser light focusing mirror 221 is configured using an off-axis parabolic mirror 222 and a planar mirror 223.

The manipulator 224 is a mechanism that adjusts at least one of the position and attitude of the laser light focusing mirror 221. The manipulator 224 adjusts at least one of the position and attitude of the laser light focusing mirror 221 such that the pulsed laser light 31 is applied to the target 27 in the plasma generation region R1.

The drive of the manipulator 224 is controlled by the controller 8.

The manipulator 224 may be a mechanism that moves the laser light focusing mirror 221 in a direction along at least one of the X-axis and the Y-axis. The manipulator 224 may be a mechanism that moves the laser light focusing mirror 221 in a direction along the Z-axis, in addition to the X-axis and the Y-axis. The manipulator 224 may be a stage as the mechanism that adjusts at least one of the position and attitude of the laser light focusing mirror 221.

The EUV light focusing optical system 23 captures the EUV light 277 included in the radiation light 276 and focuses the EUV light 277 on an intermediate focal point IF.

The EUV light focusing optical system 23 is disposed in the interior of the chamber 2.

The EUV light focusing optical system 23 includes an EUV light focusing mirror 231.

The EUV light focusing mirror 231 selectively reflects the EUV light 277 of the radiation light 276 radiated from the plasma 275, in the plasma generation region R1. The EUV light focusing mirror 231 focuses the selectively reflected EUV light 277, on the intermediate focal point IF positioned in the connection part 24.

The reflective surface of the EUV light focusing mirror 231 is formed, for example, by a multi-layer reflective film in which molybdenum and silicon are alternately laminated. The reflective surface of the EUV light focusing mirror 231 is formed, for example, by a part of a spheroidal surface having first and second focal points.

The EUV light focusing mirror 231 is disposed such that the first focal point is positioned in the plasma generation region R1 and the second focal point is positioned at the intermediate focal point IF.

A through-hole 232 is formed at the center of the EUV light focusing mirror 231. The through-hole 232 is a hole through which the pulsed laser light 31 reflected by the laser light focusing mirror 221 passes toward the plasma generation region R1.

The connection part 24 is a connection part between the chamber 2 and the exposure apparatus 9.

The connection part 24 includes an unillustrated gate valve for outputting the EUV light 277 focused on the intermediate focal point IF, to the exposure apparatus 9. The gate valve included in the connection part 24 provides communication or separation between the interior of the chamber 2 and the interior of the exposure apparatus 9, in an airtight manner.

In the interior of the connection part 24, a wall 241 is provided. On the wall 241, an aperture 242 is formed. The aperture 242 is formed at the position of the intermediate focal point IF.

The target supply device 25 is a device that melts the target 27 to be supplied into the chamber 2 and outputs the target 27 toward the plasma generation region R1 in the form of a droplet. The target supply device 25 is a device that outputs the target 27 by a so-called continuous jet method.

The target 27 to be supplied by the target supply device 25 is formed of a metal material. The metal material forming the target 27 contains tin, terbium, gadolinium, or a combination of two or more materials of them. Preferably, the metal material forming the target 27 should be tin.

The target supply device 25 is mounted on the stage 26.

The target supply device 25 is configured using a tank 251, a nozzle 252, a heater 253, a pressure adjuster 254, and a piezo element 255.

The operation of the target supply device 25 is controlled by the controller 8.

The stage 26 is a mechanism that adjusts the position of the target supply device 25. The stage 26 moves the target supply device 25 in a direction along at least one of the X-axis and the Z-axis.

The stage 26 adjusts the position of the target supply device 25 such that the target 27 output from the target supply device 25 is supplied to the plasma generation region R1.

The drive of the stage 26 is controlled by the controller 8.

The target collector 28 is a device to collect targets 27 that are of the targets 27 put into the chamber 2 and to which the pulsed laser light 31 has not been applied.

The target collector 28 is provided in the wall 211 of the chamber 2 that is on the extension of a target trajectory Q.

The target detecting sensor 41 is a sensor to detect the target 27 that passes through a target detection region R2.

The target detection region R2 is a predetermined region in the chamber 2 at a predetermined position on the target trajectory Q between the target supply device 25 and the plasma generation region R1.

The target detecting sensor 41 includes an illuminating unit 410 and a detecting unit 420.

The illuminating unit 410 and the detecting unit 420 are connected with the wall 211 of the target supply channel 212 through a window 216 and a window 217, respectively.

The illuminating unit 410 and the detecting unit 420 are disposed so as to face each other across the target detection region R2 on the target trajectory Q.

The illuminating unit 410 and the detecting unit 420 are disposed such that an illumination light axis of the illuminating unit 410 and a detection light axis of the detecting unit 420 roughly coaxially pass through the target detection region R2 as shown in FIG. 1.

The illumination light axis of the illuminating unit 410 is an optical path axis of illumination light that is output from the illuminating unit 410 toward the target detection region R2. The detection light axis of the detecting unit 420 is an optical path axis of illumination light that is of the illumination light output from the illuminating unit 410 toward the target detection region R2 and that is detected by the detecting unit 420.

The illuminating unit 410 outputs the illumination light toward the target detection region R2, so as to illuminate the target 27 that passes through the target detection region R2.

The illuminating unit 410 is configured using a light source 411 and an illuminating optical system 412.

The detecting unit 420 detects the target 27 that passes through the target detection region R2, by detecting the light intensity of the illumination light output for illuminating the target 27 that passes through the target detection region R2.

The detecting unit 420 is configured using a light sensor 421 and a light receiving optical system 422.

The EUV light sensor 43 is a sensor that measures the energy of the EUV light 277 included in the radiation light 276 radiated from the plasma 275.

The EUV light sensor 43 includes a plurality of EUV light sensors 43.

The EUV light sensors 43 measure the energy of the EUV light 277 from mutually different directions, and transmit measured values to the controller 8.

Each operation of the EUV light sensors 43 is controlled by the controller 8.

The detailed configuration of the EUV light sensor 43 will be described later, with use of FIG. 2 and FIG. 3.

The controller 8 integrally controls the operations of the elements of the EUV light generating system 11, based on a variety of commands from the exposure apparatus 9, which is an external apparatus.

The controller 8 controls the laser apparatus 3, and controls the output of the pulsed laser light 31 from the laser apparatus 3.

The controller 8 controls the target supply device 25, and controls the output of the target 27 from the target supply device 25.

The controller 8 controls the unillustrated stage on which the high reflectance mirrors 331, 332 are mounted, and controls at least one of the position and attitude of each of the high reflectance mirrors 331, 332.

The controller 8 controls the manipulator 224, and controls at least one of the position and attitude of the laser light focusing mirror 221. Thereby, the controller 8 controls the focusing position of the pulsed laser light 31 in the plasma generation region R1.

The controller 8 controls the stage 26, and controls the position of the target supply device 25. Thereby, the controller 8 controls the position of the target 27 supplied to the plasma generation region R1.

The controller 8 includes a computer in which hardware such as a processor and software such as a program module are combined. The information processing by the software included in the controller 8 is specifically realized using hardware included in the controller 8.

[2.2 Operation of Comparative Example]

The controller 8 controls the target supply device 25, and outputs the target 27 from the target supply device 25 toward the plasma generation region R1.

Specifically, the controller 8 heats the heater 253 of the target supply device 25 to a temperature higher than or equal to the melting point of the target 27, and melts the solid target 27 contained in the tank 251 of the target supply device 25. In the case where the metal material forming the target 27 is tin, the controller 8 heats the heater 253, for example, at a temperature higher than or equal to 250° C. and lower than or equal to 290° C., because the melting point of tin is 232° C.

The controller 8 controls the pressure adjuster 254 of the target supply device 25, to give a predetermined pressure to the target 27 in the tank 251 such that the target 27 in the tank 251 is continuously output from the nozzle 252 at a predetermined speed.

The controller 8 vibrates the piezo element 255 of the target supply device 25 in accordance with a predetermined waveform, divides the continuously output target 27 at a predetermined cycle to form droplet-shaped targets 27, and outputs the targets 27 from the nozzle 252 at a predetermined frequency.

The target 27 output into the chamber 2 travels on the target trajectory Q in the form of the droplet, and passes through the target detection region R2. The target 27 having passed through the target detection region R2 is supplied to the plasma generation region R1.

The target detecting sensor 41 detects the timing when the target 27 passes through the target detection region R2.

Specifically, the light source 411 of the illuminating unit 410 outputs the illumination light toward the target detection region R2 through the illuminating optical system 412, so as to illuminate the target 27 that passes through the target detection region R2.

The light sensor 421 of the detecting unit 420 detects the target 27 that passes through the target detection region R2, by detecting the illumination light output to the target detection region R2, through the light receiving optical system 422. The light intensity of the illumination light detected by the light sensor 421 may decrease whenever the target 27 passes through the target detection region R2. The light sensor 421 generates an output signal corresponding to the change in the light intensity of the detected illumination light, and transmits the output signal to the controller 8.

The output signal corresponding to the change in the light intensity of the illumination light detected by the light sensor 421 is also referred to as a passage timing signal.

The controller 8 receives the passage timing signal transmitted from the target detecting sensor 41.

The controller 8 judges the timing when the passage timing signal becomes lower than a predetermined threshold value, as the timing when the target 27 passes through the target detection region R2. That is, the controller 8 specifies the timing when the target 27 passes through the target detection region R2, based on the detection result of the target detecting sensor 41.

The controller 8 generates a target detection signal indicating that the target 27 has passed through the target detection region R2, at the timing when the passage timing signal becomes lower than the predetermined threshold value.

The timing when the target 27 passes through the target detection region R2 is also referred to as merely the passage timing for the target detection region R2.

The controller 8 transmits a trigger signal to trigger the output of the pulsed laser light 31, to the laser apparatus 3, at a timing delayed by a delay time Td from the timing when the target detection signal is generated. That is, the controller 8 causes the laser apparatus 3 to output the pulsed laser light 31, at a timing after the delay time Td since the passage timing for the target detection region R2.

The delay time Td is a time for making the timing when the pulsed laser light 31 is focused on the plasma generation region R1 roughly coincide with the timing when the target 27 is supplied to the plasma generation region R1. The delay time Td determines the timing when the pulsed laser light 31 is applied to the target 27 supplied to the plasma generation region R1. The delay time Td is previously stored in the controller 8.

The application timing of the pulsed laser light 31 to the target 27 supplied to the plasma generation region R1 is also referred to as merely the application timing of the pulsed laser light 31.

When the laser apparatus 3 receives the trigger signal, the laser apparatus 3 outputs the pulsed laser light 31.

The pulsed laser light 31 output from the laser apparatus 3 is reflected by the high reflectance mirrors 331, 332 of the laser light delivery optical system 33, passes through the window 215, and is introduced into the chamber 2. The pulsed laser light 31 introduced into the chamber 2 is focused on the plasma generation region R1 by the laser light focusing optical system 22. The pulsed laser light 31 focused on the plasma generation region R1 is applied to the target 27 supplied to the plasma generation region R1.

By the emission of the pulsed laser light 31, the target 27 supplied to the plasma generation region R1 generates plasma, and radiates the radiation light 276. The EUV light 277 included in the radiation light 276 is selectively reflected by the EUV light focusing mirror 231 of the EUV light focusing optical system 23, and is focused on the intermediate focal point IF of the connection part 24. The EUV light 277 focused on the intermediate focal point IF is output toward the exposure apparatus 9.

[2.3 EUV Light Sensor and EUV Light Centroid Control]

Figure 2:
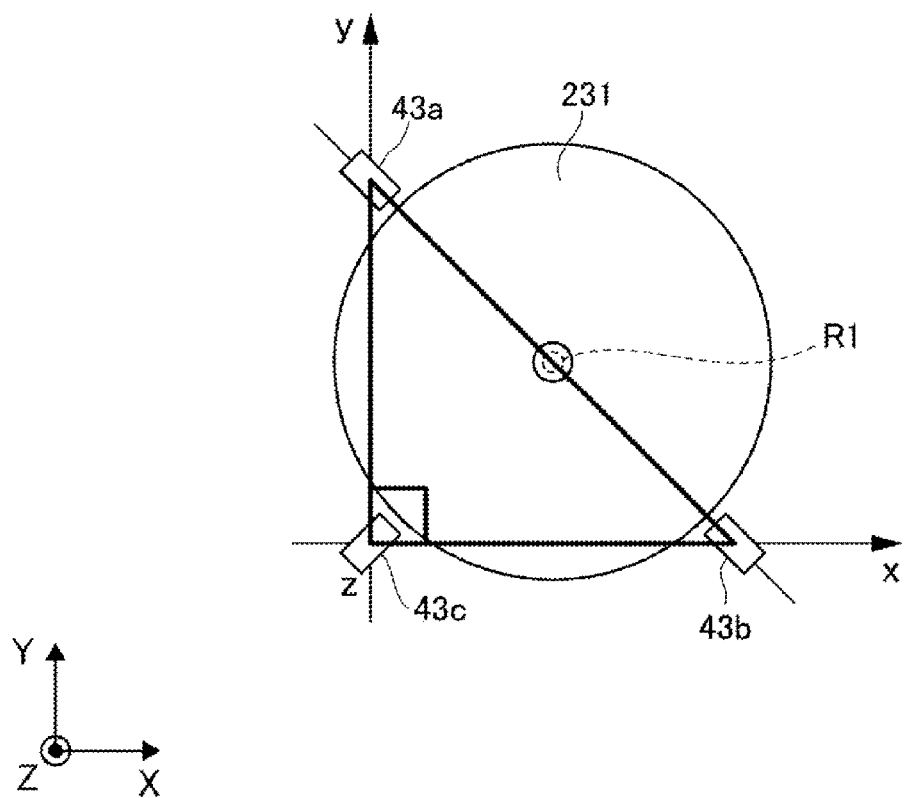
FIG. 2 shows a diagram for describing the disposition of EUV light sensors shown in FIG. 1.
Figure 3:
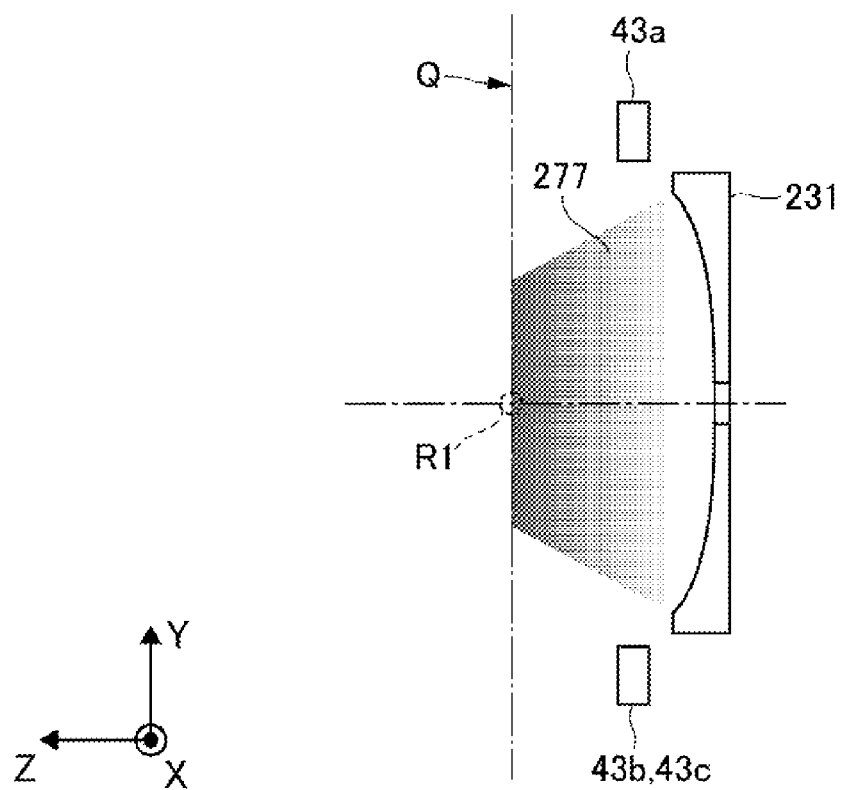
FIG. 3 shows a diagram of the disposition of the EUV light sensors shown in FIG. 2, viewed from a direction opposite to an X-axis direction.

FIG. 2 shows a diagram for describing the disposition of the EUV light sensor 43 shown in FIG. 1. FIG. 3 shows a diagram of the disposition of the EUV light sensor 43 shown in FIG. 2, viewed from a direction opposite to the X-axis direction.

The plurality of EUV light sensors 43 according to the comparative example include at least three EUV light sensors 43. The plurality of EUV light sensors 43 is configured, for example, by EUV light sensors 43a to 43c, as shown in FIG. 2 and FIG. 3.

The EUV light sensors 43a to 43c are provided on the wall 211 of the chamber 2, so as to face the plasma generation region R1 from mutually different directions. The EUV light sensors 43a to 43c are disposed so as not to interrupt the optical path of the EUV light 277 reflected by the EUV light focusing mirror 231. The EUV light sensors 43a to 43c are disposed along the outer peripheral rim of the EUV light focusing mirror 231. The EUV light sensors 43a to 43c are disposed at a mutually equal distance from the plasma generation region R1, for reducing differences in energy measured by the EUV light sensors 43a to 43c when the plasma 275 is generated in the plasma generation region R1.

The EUV light sensors 43a to 43c are disposed at positions that make it easy to evaluate the centroid of the EUV light 277.

For example, the EUV light sensors 43a to 43c are at the corners of an isosceles right triangle shown in FIG. 2, respectively. The isosceles right triangle shown in FIG. 2 is an isosceles right triangle in which the middle point of the long side of the triangle is positioned in the plasma generation region R1, the apex of the triangle is positioned on the Z-axis, and the two short sides are disposed along the X-axis and the Y-axis, respectively.

The EUV light sensor 43a is disposed at a corner of the isosceles right triangle shown in FIG. 2 and is positioned on an axis along the Y-axis. The EUV light sensor 43b is disposed at a corner of the isosceles right triangle shown in FIG. 2 and is positioned on an axis along the X-axis. The EUV light sensor 43c is disposed at a corner of the isosceles right triangle shown in FIG. 2 and is positioned on the Z-axis.

The centroid of the EUV light 277 is the centroid in the energy distribution of the EUV light 277. That is, the centroid of the EUV light 277 is a position corresponding to the weighted average in the energy distribution of the EUV light 277. Specifically, the centroid of the EUV light 277 is a spatial position that is specified from a plurality of measured values obtained when the energy of the EUV light 277 is measured by the EUV light sensors 43a to 43c.

The centroid of the EUV light 277 is an index that reflects the application position of the pulsed laser light to the target 27 supplied to the plasma generation region R1. The centroid of the EUV light 277 is an index for evaluating whether or not the application condition of the pulsed laser light 31 provides satisfied properties of the EUV light 277. Such a control that the centroid of the EUV light 277 becomes a targeted centroid means an appropriate application of the pulsed laser light 31 to the target 27. For example, the targeted centroid is a predetermined position in the plasma generation region R1.

The controller 8 according to the comparative example defines the calculated value of Expression 1, as an evaluated value that indicates an index for evaluating an X-axis coordinate component at the centroid of the EUV light 277. The controller 8 defines the calculated value of Expression 2, as an evaluated value that indicates an index for evaluating a Y-axis coordinate component at the centroid of the EUV light 277. The definitions of the evaluated values presuppose that the targeted centroid of the EUV light 277 is positioned at an equal distance from each of the EUV light sensors 43a, 43b, 43c shown in FIG. 2.

$$EUV \text{ Centroid\_}x[\%] = \{(E2-E3)/(E2+E3)\} \times 100 \quad \text{[Expression 1]}$$

$$EUV \text{ Centroid\_}y[\%] = \{(E1-E3)/(E1+E3)\} \times 100 \quad \text{[Expression 2]}$$

E1 is a measured value of the EUV light sensor 43a. E2 is a measured value of the EUV light sensor 43b. E3 is a measured value of the EUV light sensor 43c.

EUV Centroid_x is a value resulting from standardizing the deviation between the X-axis coordinate component at the current centroid of the EUV light 277 and the X-axis coordinate component at the targeted centroid. EUV Centroid_x indicates the unevenness degree of the energy distribution of the EUV light 277 in the direction along the X-axis. EUV Centroid_y is a value resulting from standardizing the deviation between the Y-axis coordinate component at the current centroid of the EUV light 277 and the Y-axis coordinate component at the targeted centroid. EUV Centroid_y indicates the unevenness degree of the energy distribution of the EUV light 277 in the direction along the Y-axis.

The controller 8 is configured to execute EUV light centroid control.

The EUV light centroid control is a feedback control of controlling the laser light focusing optical system 22 such that the centroid of the EUV light 277 becomes the targeted centroid, during the generation of the EUV light 277, based on the measurement results of the EUV light sensors 43a to 43c.

Specifically, the controller 8 has a function to execute the following processes, as the EUV light centroid control.

The controller 8 transmits a first gate signal to the EUV light sensors 43a to 43c, at a timing delayed by a predetermined delay time from the timing when the target detection signal is generated.

The first gate signal is a signal that triggers the measurement of the energy of the EUV light 277 by the EUV light sensors 43a to 43c.

When the EUV light sensors 43a to 43c receive the first gate signal, the EUV light sensors 43a to 43c measure the energy of the EUV light 277 and transmit the measured values E1 to E3 to the controller 8, respectively.

The controller 8 evaluates the centroid of the EUV light 277, using Expression 1 and Expression 2.

The controller 8 specifies the deviation between the current centroid of the EUV light 277 and the targeted centroid, from the respective calculated values of Expression 1 and Expression 2.

The controller 8 sets a targeted application position of the application position of the pulsed laser light 31 to the target 27 supplied to the plasma generation region R1, such that the centroid of the EUV light 277 becomes the targeted centroid. Then, the controller 8 controls the laser light focusing optical system 22 depending on the set targeted application position. Specifically, the controller 8 specifies the deviation between the current application position of the pulsed laser light 31 to the target 27 supplied to the plasma generation region R1 and the targeted application position of the pulsed laser light corresponding to the targeted centroid. Then, the controller 8 specifies the deviation between the current focusing position of the pulsed laser light 31 and a targeted focusing position of the pulsed laser light 31 corresponding to the targeted application position. Then, the controller 8 determines the drive amount of the manipulator 224 such that the deviation of the focusing position of the pulsed laser light 31 is reduced. The controller 8 drives the manipulator 224 depending on the determined drive amount, and moves the focusing position of the pulsed laser light 31.

Thereby, the controller 8 can make the application position of the pulsed laser light 31 to the target 27 supplied to the plasma generation region R1 roughly coincide with the targeted application position, and can make the centroid of the EUV light 277 roughly coincide with the targeted centroid.

In the EUV light centroid control, the controller 8 may move the focusing position of the pulsed laser light 31, by driving the above-described stage on which the high reflectance mirror 331 is mounted and the above-described stage on which the high reflectance mirror 332 is mounted, instead of driving the manipulator 224. The controller 8 may drive one of the manipulator 224, the stage on which the high reflectance mirror 331 is mounted, and the stage on which the high reflectance mirror 332 is mounted, depending on the movement amount or movement speed of the focusing position of the pulsed laser light 31.

Through the execution of the EUV light centroid control by the controller 8, the relative positional relation between the position of the target 27 supplied to the plasma generation region R1 and the focusing position of the pulsed laser light 31 becomes an appropriate positional relation. That is, through the execution of the EUV light centroid control by the controller 8, the application position of the pulsed laser light 31 to the target 27 supplied to the plasma generation region R1 becomes an appropriate position.

When the relative positional relation between the position of the target 27 supplied to the plasma generation region R1 and the focusing position of the pulsed laser light 31 is mismatched, the properties of the EUV light 277 to be output from the EUV light generating apparatus 1 sometimes deteriorate.

The index for evaluating the properties of the EUV light 277 is, for example, the energy or energy stability of the EUV light 277. The deterioration of the properties of the EUV light 277 means, for example, that the energy or energy stability of the EUV light 277 to be output from the EUV light generating apparatus 1 deviates from the permissible range. The energy stability of the EUV light 277 is the variation in the energy of the EUV light 277, and is described as $3\sigma$, for example.

The application position of the pulsed laser light 31 to the target 27 supplied to the plasma generation region R1 is also referred to as merely the application position of the pulsed laser light 31.

The application of the pulsed laser light 31 to the target 27 supplied to the plasma generation region R1 is also referred to as shooting.

The mismatch of the relative positional relation between the position of the target 27 supplied to the plasma generation region R1 and the focusing position of the pulsed laser light 31 is also referred to as shooting mismatch.

[2.4 Problem]

The radiation light 276 radiated from the plasma 275 is thought to diverge isotropically with respect to the plasma generation region R1.

Therefore, in the case where the EUV light sensors 43a to 43c have roughly the same detection sensitivity, the measured values E1 to E3 of the EUV light sensors 43a to 43c are roughly the same, in a shooting condition in which the generation efficiency of the EUV light 277 is high. In this case, the calculated values of Expression and Expression 2, each of which is an index for evaluating the centroid of the EUV light 277, are roughly zero.

In the case where the calculated values of Expression 1 and Expression 2 are roughly zero, the centroid of the EUV light 277 roughly coincides with the targeted centroid. In other words, in the case where the EUV light sensors 43a to 43c have roughly the same detection sensitivity, the targeted centroids corresponding to the calculated values of Expression 1 and Expression 2 are set to zero.

Meanwhile, there are often individual differences among the EUV light sensors 43a to 43c. Therefore, there are sometimes significant differences among the detection sensitivities of the EUV light sensors 43a to 43c. In this case, the calculated values of Expression 1 and Expression 2 sometimes do not become roughly zero, even when the centroid of the EUV light 277 roughly coincides with the targeted centroid.

Further, the EUV light sensors 43a to 43c are sometimes polluted by debris, which is the target 27 not contributing to the generation of the EUV light 277. On this occasion, the manner of the pollution of the EUV light sensor 43 is sometimes different for each of the EUV light sensors 43a to 43c. In this case, the calculated values of Expression 1 and Expression 2 sometimes do not become roughly zero, even when the centroid of the EUV light 277 roughly coincides with the targeted centroid.

Therefore, sometimes, even when the controller 8 according to the comparative example executes the EUV light centroid control while uniquely setting the targeted centroids corresponding to the calculated values of Expression 1 and Expression 2 to zero, the application position of the pulsed laser light 31 does not become an appropriate position, and the shooting mismatch cannot be suppressed.

Accordingly, there has been demanded a technique of appropriately executing the EUV light centroid control by calibrating the targeted centroid of the centroid of the EUV light 277 and allowing the shooting mismatch to be suppressed.

3. First Embodiment

An EUV light generating apparatus 1 of a first embodiment will be described with use of FIG. 2 to FIG. 13.

The EUV light generating apparatus 1 of the first embodiment has a function to calibrate the targeted centroid of the centroid of the EUV light 277.

In the configuration and operation of the EUV light generating apparatus 1 of the first embodiment, descriptions for the same configuration and operation as those of the EUV light generating apparatus 1 of the comparative example are omitted.

[3.1 Configuration]

The EUV light generating apparatus 1 of the first embodiment may include an application position adjusting unit 7.

The application position adjusting unit 7 is a mechanism that adjusts the application position of the pulsed laser light 31.

The application position adjusting unit 7 is configured using the laser light focusing optical system 22 shown in FIG. 2.

In the case of driving the stage on which the high reflectance mirror 331 is mounted and the stage on which the high reflectance mirror 332 is mounted in the EUV light centroid control instead of driving the manipulator 224, the application position adjusting unit 7 may be configured using these stages. Alternatively, the application position adjusting unit 7 may be configured using the stages on which the high reflectance mirrors 331, 332 are mounted and the laser light focusing optical system 22.

The operation of the application position adjusting unit 7 is controlled by the controller 8.

The controller 8 according to the first embodiment includes the function to calibrate the targeted centroid of the centroid of the EUV light 277 in the execution of the EUV light centroid control.

Specifically, in the execution of the EUV light centroid control, the controller 8 controls the application position adjusting unit 7 such that the application position of the pulsed laser light 31 is scanned in accordance with a reference scan point group including a plurality of reference scan points that are mutually different in position. Then, the controller 8 acquires the measured result of the EUV light sensor 43 for each of the reference scan points. Then, from the acquired measured result of the EUV light sensor 43, the controller 8 specifies the evaluated value of the centroid of the EUV light 277 for each of the reference scan points. Then, the controller 8 calibrates the targeted centroid of the centroid of the EUV light 277, based on the acquired measured result of the EUV light sensor 43 and the specified evaluated value of the centroid.

The other configuration of the EUV light generating apparatus 1 of the first embodiment is the same as that of the EUV light generating apparatus 1 of the comparative example.

[3.2 Operation]

The operation of the EUV light generating apparatus 1 of the first embodiment will be described. Specifically, a process that is executed by the controller 8 according to the first embodiment for calibrating the targeted centroid of the centroid of the EUV light 277 will be described. The "targeted centroid of the centroid" is the targeted value of the centroid, in other words.

The process that is executed by the controller 8 for calibrating the targeted centroid of the centroid of the EUV light 277 in the execution of the EUV light centroid control is also referred to as merely a calibration process for the targeted centroid.

Figure 4:
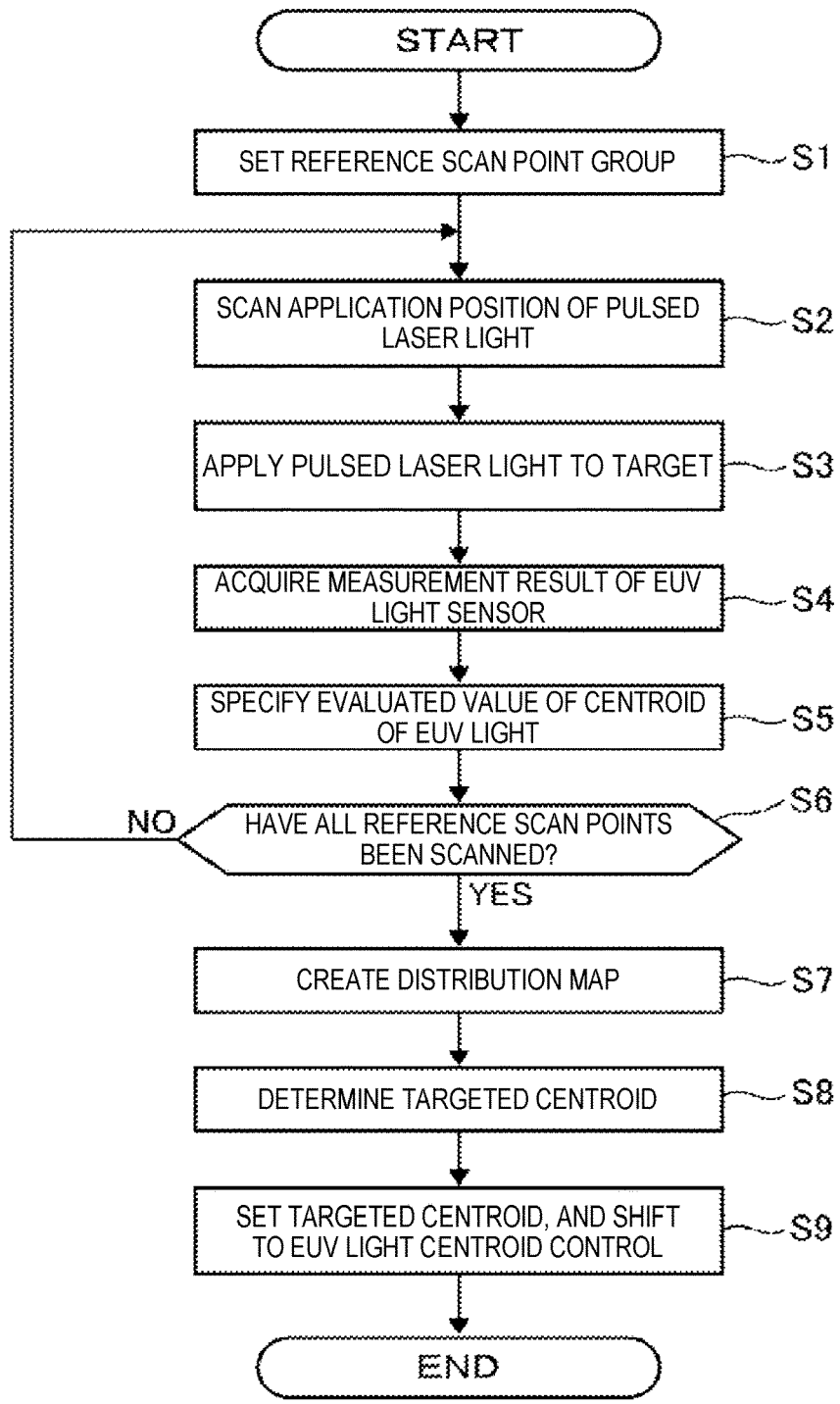
FIG. 4 shows a flowchart for describing a calibration process for a targeted centroid that is executed by a controller according to a first embodiment.
Figures 5, 6:
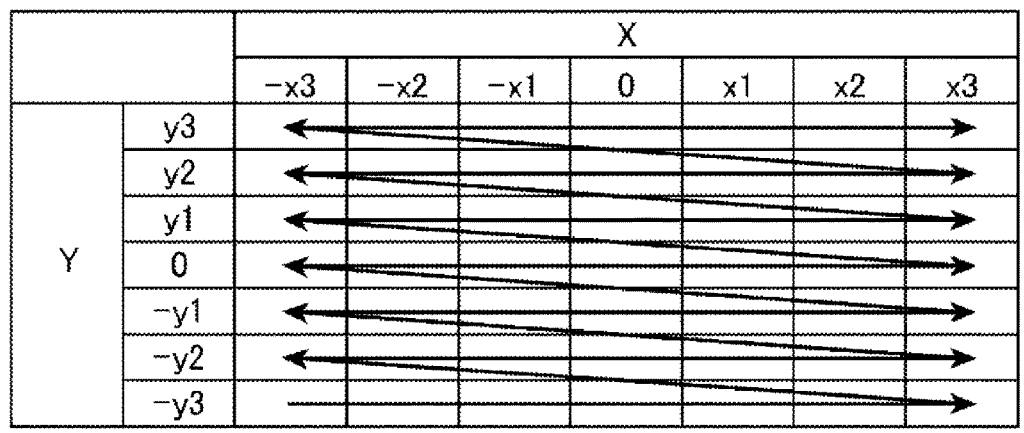
FIG. 5 shows an exemplary reference scan point group that is set in step S1 of FIG. 4.
FIG. 6 shows an exemplary distribution map of the energy of EUV light that is created in step S7 of FIG. 4.

FIG. 4 shows a flowchart for describing the calibration process for the targeted centroid that is executed by the controller 8 according to the first embodiment. FIG. 5 shows an exemplary reference scan point group that is set in step S1 of FIG. 4. FIG. 6 shows an exemplary distribution map of the energy of the EUV light 277 that is created in step S7 of FIG. 4. FIG. 7 shows an exemplary distribution map of evaluated values of the X-axis coordinate component of the centroid of the EUV light 277 that is created in step S7 of FIG. 4. FIG. 8 shows an exemplary distribution map of evaluated values of the Y-axis coordinate component of the centroid of the EUV light 277 that is created in step S7 of FIG. 4.

The time when the controller 8 executes the calibration process for the targeted centroid will be described later with use of FIG. 21.

In step S1, the controller 8 sets the reference scan point group.

The controller 8 controls the application position adjusting unit 7 such that the application position of the pulsed laser light 31 is scanned on an XY plane crossing the plasma generation region R1. The controller 8 acquires the measured result of the EUV light sensor 43 for each scan.

The Rayleigh length of the pulsed laser light 31 in the plasma generation region R1 is 100 μm or more and 1000 μm or less. Therefore, even when the application position of the pulsed laser light 31 is scanned in the Z-axis direction, the amount of the change in the acquired measured result for each scan may be small. In other words, even when the application position of the pulsed laser light 31 is scanned in the Z-axis direction, the scan does not exert a great influence on the EUV light centroid control. Therefore, the controller 8 makes the application position adjusting unit 7 scan the application position of the pulsed laser light 31 on the XY plane crossing the plasma generation region R1. The XY plane is perpendicular to a traveling direction in which the pulsed laser light 31 travels toward the plasma generation region R1.

In the scan of the application position of the pulsed laser light 31, as shown in FIG. 5, the controller 8 makes the application position adjusting unit 7 scan the application position of the pulsed laser light 31 in accordance with a reference scan point group including a plurality of reference scan points that are mutually different in position. That is, each of the reference scan points included in the reference scan point group is a position where the application position of the pulsed laser light 31 is scanned. The arrow in FIG. 5 shows the scan order for the reference scan points.

As shown in FIG. 5, the reference scan point group is created using a table in which positions are arrayed in a matrix with respect to the current application position. The reference scan points included in the reference scan point group indicate a plurality of positions that are arrayed along the X-axis and the Y-axis on the XY plane crossing the plasma generation region R1.

The reference scan point group is determined by a scan width R and an interval S. The scan width R is each of the X-axis directional and Y-axis directional widths of a scan range indicated by the whole of the reference scan point group. The interval S is a scan interval among the reference scan points.

The scan width R is determined depending on a diameter D of the pulsed laser light 31 in the plasma generation region R1. The diameter D is previously determined by an experiment, a simulation, or the like. Alternatively, the diameter D may be estimated, for example, from the disposition angle of an optical element included in the laser light focusing optical system 22 or the laser light delivery optical system 33. For example, the scan width R is a length that is contained in a range of (⅓)D or more and (⅔)D or less. For example, the scan width R is (⅔)D.

The interval S is calculated from (R/N). N is a division number when the scan width R is divided into a plurality of reference scan points in each of the directions along the X-axis and the Y-axis. That is, when the division number is N, the number of reference scan points in each of the X-axis and Y-axis directions is N+1. For example, the division number N is a natural number of 2 or more and 6 or less.

Specifically, for example, the diameter D is 120 μm. When the diameter D is 120 μm, the scan width R is 80 μm, for example. For example, the division number N is 6, as shown in FIG. 5. When the scan width R is 80 μm and the division number N is 6, the interval S is 13 μm, for example.

The scan width R may be determined depending on the spot diameter of the pulsed laser light 31 that is the beam diameter of the pulsed laser light 31 at a beam waist portion. In this case, the scan width R is determined by replacing the above-described diameter D with the spot diameter of the pulsed laser light 31.

The controller 8 may previously hold a plurality of reference scan point groups, and may read a reference scan point group depending on the application condition and diameter D of the pulsed laser light 31. Alternatively, the controller 8 may create a reference scan point group depending on the application condition and diameter D of the pulsed laser light 31. Then, the controller 8 sets the read reference scan point group or the created reference scan point group.

In step S2, the controller 8 controls the application position adjusting unit 7 such that the application position of the pulsed laser light 31 is scanned in accordance with the set reference scan point group.

In step S3, the controller 8 transmits the trigger signal to the laser apparatus 3, to make the laser apparatus 3 apply the pulsed laser light 31 to the target 27. Thereby, the EUV light 277 is generated.

In step S4, the controller 8 acquires the measurement result of the EUV light sensor 43.

Specifically, the controller 8 performs the statistical processing of the measured values transmitted from the EUV light sensors 43a to 43c, and acquires the energy of the EUV light 277. The energy of the EUV light 277 may be the average value of the measured values transmitted from the EUV light sensors 43*a* to 43*c*.

The controller 8 acquires the energy of the EUV light 277 as the measurement result of the EUV light sensor 43, and stores the energy of the EUV light 277 in association with the current reference scan point.

In addition to the energy of the EUV light 277, the controller 8 may acquire the variation in the energy of the EUV light 277, as the measurement result of the EUV light sensor 43. The variation in the energy of the EUV light 277 may be 3σ, for example.

In step S5, the controller 8 specifies the evaluated value of the centroid of the EUV light 277.

Specifically, the controller 8 calculates Expression 1 and Expression 2 based on the measurement result of the EUV light sensor 43 acquired in step S4. Then, the controller 8 specifies the calculated value of Expression 1, as the evaluated value of the X-axis coordinate component of the centroid of the EUV light 277. The controller 8 specifies the calculated value of Expression 2, as the evaluated value of the Y-axis coordinate component of the centroid of the EUV light 277. Then, the controller 8 stores the respective calculated values of Expression 1 and Expression 2 specified as the evaluated values of the centroid of the EUV light 277, in association with the current reference scan point.

In step S6, the controller 8 determines whether or not all reference scan points included in the set reference scan point group have been scanned.

If all reference scan points have not been scanned, the controller 8 goes to step S2. On the other hand, if all reference scan points have been scanned, the controller 8 goes to step S7.

In step S7, the controller 8 creates a distribution map of the energy of the EUV light 277 shown in FIG. 6, based on measurement results of the EUV light sensor 43 stored in association with the reference scan points. In addition, the controller 8 creates a distribution map of the evaluated value of the X-axis coordinate component of the centroid of the EUV light 277 shown in FIG. 7, based on calculated values of Expression 1 stored in association with the reference scan point. In addition, the controller 8 creates a distribution map of the evaluated value of the Y-axis coordinate component of the centroid of the EUV light 277 shown in FIG. 8, based on calculated values of Expression 2 stored in association with the reference scan points.

In step S8, the controller 8 determines the targeted centroid based on the distribution maps created in step S7.

A process in which the controller 8 determines the targeted centroid will be described later with use of FIG. 6 to FIG. 13.

In step S9, the controller 8 sets the targeted centroid determined in step S8, as a new targeted centroid. Then, the controller 8 shifts to the EUV light centroid control.

The controller 8 sets the targeted application position of the application position of the pulsed laser light 31, such that the centroid of the EUV light 277 becomes the new targeted centroid. Then, the controller controls the application position adjusting unit 7 according to the set targeted application position.

Specifically, the controller 8 specifies the deviation between the current application position of the pulsed laser light 31 and the new targeted application position of the pulsed laser light 31 corresponding to the new targeted centroid.

Then, the controller 8 specifies the deviation between the current focusing position of the pulsed laser light 31 and a new targeted focusing position of the pulsed laser light 31 corresponding to the new targeted application position. Then, the controller 8 determines the adjustment amount of the application position adjusting unit 7 such that the deviation of the focusing position of the pulsed laser light 31 is reduced.

Alternatively, the controller 8 previously holds a table showing the correspondence relation between the deviation of the application position of the pulsed laser light 31 and the adjustment amount of the application position adjusting unit 7. Then, by referring to this table, the controller 8 determines the adjustment amount of the application position adjusting unit 7 such that the deviation of the application position of the pulsed laser light 31 is reduced. Further, the controller 8 may previously hold a function defining the correspondence relation between the deviation of the application position of the pulsed laser light 31 and the adjustment amount of the application position adjusting unit 7. Then, by calculating this function, the controller 8 may determine the adjustment amount of the application position adjusting unit 7 such that the deviation of the application position of the pulsed laser light 31 is reduced.

Then, the controller 8 controls the application position adjusting unit 7 according to the determined adjustment amount, and moves the focusing position of the pulsed laser light 31. Thereby, the controller 8 can make the application position of the pulsed laser light 31 roughly coincide with the new targeted application position, and can make the centroid of the EUV light 277 roughly coincide with the new targeted centroid.

In this way, the controller 8 can calibrate the targeted centroid, whenever the EUV light centroid control is executed.

[3.3 Determination of Targeted Centroid]

The process in which the controller 8 determines the targeted centroid in step S8 of FIG. 4 will be described with use of FIG. 6 to FIG. 13.

Figures 11, 12:
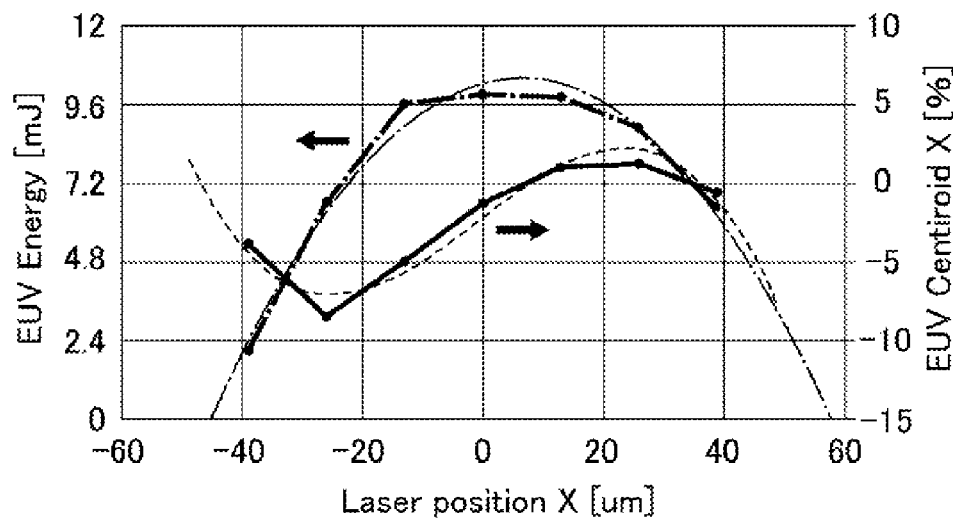
FIG. 11 shows a plurality of reference scan points that are arrayed along the Y-axis with respect to the reference scan point A shown in FIG. 6 and evaluated values of the Y-axis coordinate component of the centroid of the EUV light that are stored in association with the reference scan points.
FIG. 12 shows a distribution of the energy of the EUV light and a distribution of the evaluated value of the centroid in the direction along the X-axis.
Figures 13, 14:
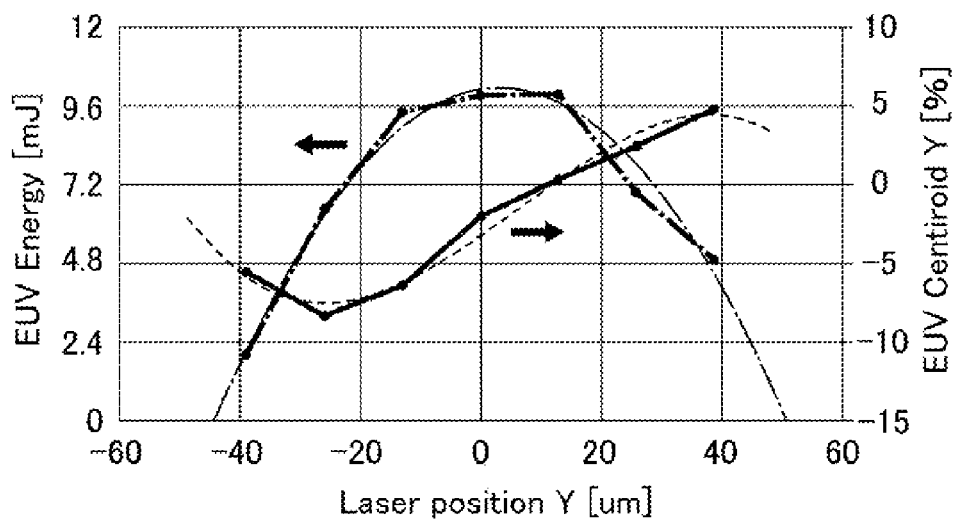
FIG. 13 shows a distribution of the energy of the EUV light and a distribution of the evaluated value of the centroid in the direction along the Y-axis.
FIG. 14 shows a plurality of reference scan points that are arrayed along the X-axis and the Y-axis with respect to a reference scan point B shown in FIG. 6 and measurement results of the EUV light sensors that are stored in association with the reference scan points.

FIG. 9 shows a plurality of reference scan points that are arrayed along the X-axis and the Y-axis with respect to a reference scan point A shown in FIG. 6 and measurement results of the EUV light sensor 43 that are stored in association with the reference scan points. FIG. 10 shows a plurality of reference scan points that are arrayed along the X-axis with respect to the reference scan point A shown in FIG. 6 and evaluated values of the X-axis coordinate component of the centroid of the EUV light 277 that are stored in association with the reference scan points. FIG. 11 shows a plurality of reference scan points that are arrayed along the Y-axis with respect to the reference scan point A shown in FIG. 6 and evaluated values of the Y-axis coordinate component of the centroid of the EUV light 277 that are stored in association with the reference scan points. FIG. 12 shows a distribution of the energy of the EUV light 277 and a distribution of the evaluated value of the centroid in the direction along the X-axis. FIG. 13 shows a distribution of the energy of the EUV light 277 and a distribution of the evaluated value of the centroid in the direction along the Y-axis.

The controller 8 determines the targeted centroid by performing the following process based on the distribution maps created in step S7 of FIG. 4.

Specifically, as shown in FIG. 6, the controller 8 specifies a range K of reference scan points in which the energy of the EUV light 277 is in a predetermined range, from the measurement results of the EUV light sensor 43 acquired for the reference scan points included in the set reference scan point group. The predetermined range is a range in which the energy of the EUV light 277 is in the top 10%, for example.

Subsequently, the controller 8 calculates the weighted average value of the measurement results of the EUV light sensor 43 that are stored in association with the reference scan points in the specified range K. Then, as shown in FIG. 6, the controller 8 specifies the reference scan point A that gives the measurement result of the EUV light sensor 43 closest to the weighted average value.

Subsequently, as shown in FIG. 9, the controller 8 specifies a plurality of reference scan points arrayed along the X-axis with respect to the specified reference scan point A and a plurality of reference scan points arrayed along the Y-axis with respect to the specified reference scan point A.

Subsequently, as shown in FIG. 10, the controller 8 specifies evaluated values of the X-axis coordinate component of the centroid of the EUV light 277 that are stored in association with the reference scan points arrayed along the X-axis with respect to the reference scan point A. In addition, as shown in FIG. 11, the controller 8 specifies evaluated values of the Y-axis coordinate component of the centroid of the EUV light 277 that are stored in association with the reference scan points arrayed along the Y-axis with respect to the reference scan point A.

Then, as shown by the solid line in FIG. 12, the controller 8 obtains a distribution of the evaluated value of the centroid of the EUV light 277 in the direction along the X-axis with respect to the reference scan point A, from the evaluated values specified as shown in FIG. 10. In addition, as shown by the solid line in FIG. 13, the controller 8 obtains a distribution of the evaluated value of the centroid of the EUV light 277 in the direction along the Y-axis with respect to the reference scan point A, from the evaluated values specified as shown in FIG. 11.

As shown by the solid lines in FIG. 12 and FIG. 13, each of the distributions of the evaluated value of the centroid of the EUV light 277 linearly changes at the reference scan point A and at positions near the reference scan point A, and non-linearly changes at positions away from the reference scan point A. At the portion where the distribution of the evaluated value of the centroid of the EUV light 277 non-linearly changes, it is thought that the application position of the pulsed laser light 31 deviates from the appropriate position and is an application position where a relatively great shooting mismatch occurs.

Hence, as shown by the broken lines in FIG. 12 and FIG. 13, the controller 8 performs the fitting of the distributions of the evaluated value of the centroid of the EUV light 277, for cubic functions. Then, the controller 8 determines that the targeted centroid is a position corresponding to inflection points in cubic curves that are shown by the cubic functions obtained by the fitting. That is, the controller 8 determines that the X-axis coordinate component of the targeted centroid position is a position corresponding to the inflection point in the cubic curve shown by the broken line in FIG. 12. The controller 8 determines that the Y-axis coordinate component of the targeted centroid is a position corresponding to the inflection point in the cubic curve shown by the broken line in FIG. 13.

Alternatively, the controller 8 may perform the fitting of the distributions of the evaluated value of the centroid of the EUV light 277, for linear functions. Then, the controller 8 may determine that the X-axis and Y-axis coordinate components of the target centroid are positions corresponding to middle points in line segments that are shown by the linear functions obtained by the fitting.

Alternatively, the controller 8 may specify the maximum values and minimum values in the distributions of the evaluated value of the centroid of the EUV light 277. Then, the controller 8 may determine that the X-axis and Y-axis coordinate components of the targeted centroid are positions corresponding to the respective average values of the specified maximum values and minimum values.

Further, as shown in FIG. 9, the controller 8 specifies measurement results of the EUV light sensor 43 that are stored in association with the reference scan points arrayed along the X-axis with respect to the reference scan point A. In addition, as shown in FIG. 9, the controller 8 specifies measurement results of the EUV light sensor 43 that are stored in association with the reference scan points arrayed along the Y-axis with respect to the reference scan point A.

Then, as shown by the bold chain line in FIG. 12, the controller 8 obtains an energy distribution of the EUV light 277 in the direction along the X-axis with respect to the reference scan point A, from the measurement results of the EUV light sensor 43 specified as shown in FIG. 9. In addition, as shown by the bold chain line in FIG. 13, the controller 8 obtains an energy distribution of the EUV light 277 in the direction along the Y-axis with respect to the reference scan point A, from the measurement results of the EUV light sensor 43 specified as shown in FIG. 9.

Then, as shown by the thin chain lines in FIG. 12 and FIG. 13, the controller 8 performs the fitting of the energy distributions of the EUV light 277, for quadratic functions or Gaussian functions.

The other operation of the EUV light generating apparatus 1 of the first embodiment is the same as that of the EUV light generating apparatus 1 of the comparative example.

[3.4 Effect]

The controller 8 according to the first embodiment can calibrate the targeted centroid of the centroid of the EUV light 277, whenever the EUV light centroid control is executed. That is, the controller 8 can calibrate the targeted centroid to an optimal position in consideration of the measurement accuracy, even when the measurement accuracy of the EUV light sensor 43 is unstable due to the influence of the detection sensitivity, the manner of the pollution, and the like.

Thereby, the EUV light generating apparatus 1 of the first embodiment can constantly execute appropriate EUV light centroid control, and therefore, can control the application position of the pulsed laser light 31 to an appropriate position.

As a result, the EUV light generating apparatus 1 of the first embodiment can suppress the shooting mismatch, and therefore, can suppress the deterioration of the properties of the EUV light 277.

4. Second Embodiment

An EUV light generating apparatus 1 of a second embodiment will be described with use of FIG. 6 to FIG. 8 and FIG. 14 to FIG. 18.

The EUV light generating apparatus 1 of the second embodiment has the same configuration as that of the EUV light generating apparatus 1 of the first embodiment.

However, the EUV light generating apparatus 1 of the second embodiment is different from the EUV light generating apparatus 1 of the first embodiment, in the operation of the controller 8 about the process for determining the targeted centroid of the centroid of the EUV light 277.

In the configuration and operation of the EUV light generating apparatus 1 of the second embodiment, descriptions for the same configuration and operation as those of the EUV light generating apparatus 1 of the first embodiment are omitted.

Figure 17:
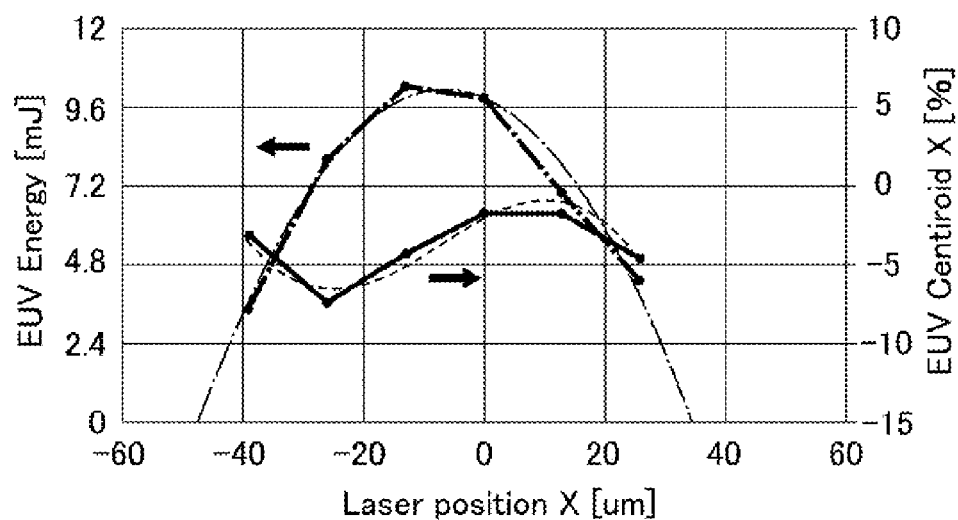
FIG. 17 shows a distribution of the energy of the EUV light and a distribution of the evaluated value of the centroid in the direction along the X-axis with respect to the reference scan point B.
Figure 18:
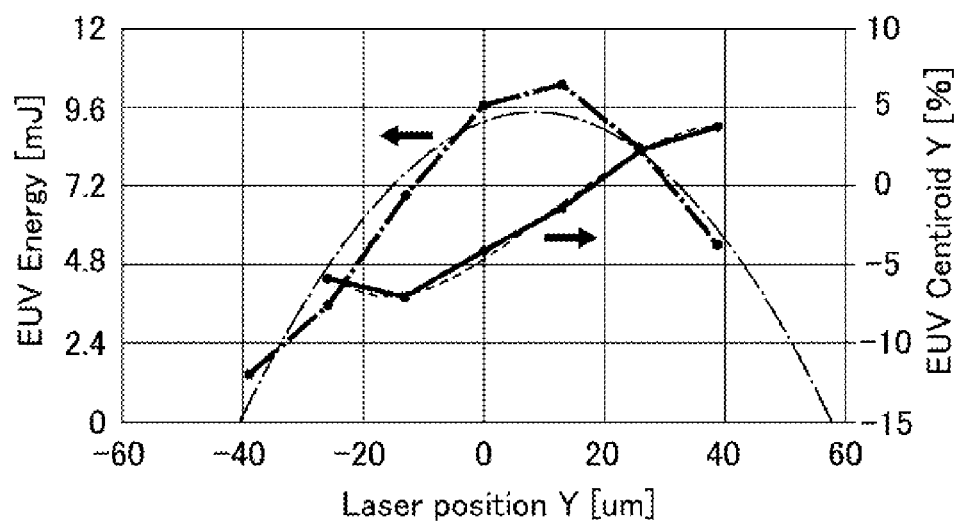
FIG. 18 shows a distribution of the energy of the EUV light and a distribution of the evaluated value of the centroid in the direction along the Y-axis with respect to the reference scan point B.

FIG. 14 shows a plurality of reference scan points that are arrayed along the X-axis and the Y-axis with respect to a reference scan point B shown in FIG. 6 and measurement results of the EUV light sensor 43 that are stored in association with the reference scan points. FIG. 15 shows a plurality of reference scan points that are arrayed along the X-axis with respect to the reference scan point B shown in FIG. 6 and evaluated values of the X-axis coordinate component of the centroid of the EUV light 277 that are stored in association with the reference scan points. FIG. 16 shows a plurality of reference scan points that are arrayed along the Y-axis with respect to the reference scan point B shown in FIG. 6 and evaluated values of the Y-axis coordinate component of the centroid of the EUV light 277 that are stored in association with the reference scan points. FIG. 17 shows a distribution of the energy of the EUV light 277 and a distribution of the evaluated value of the centroid in the direction along the X-axis with respect to the reference scan point B. FIG. 18 shows a distribution of the energy of the EUV light 277 and a distribution of the evaluated value of the centroid in the direction along the Y-axis with respect to the reference scan point B.

The controller 8 according to the second embodiment determines the targeted centroid by performing the following process based on the distribution maps created in step S7 of FIG. 4.

Specifically, as shown in FIG. 6, the controller 8 specifies the reference scan point B that gives the maximum energy of the EUV light 277, from the measurement results of the EUV light sensor 43 acquired for the reference scan points included in the set reference scan point group.

Subsequently, as shown in FIG. 14, the controller 8 specifies a plurality of reference scan points arrayed along the X-axis with respect to the specified reference scan point B and a plurality of reference scan points arrayed along the Y-axis with respect to the specified reference scan point B.

Subsequently, as shown in FIG. 15, the controller 8 specifies evaluated values of the X-axis coordinate component of the centroid of the EUV light 277 that are stored in association with the reference scan points arrayed along the X-axis with respect to the reference scan point B. In addition, as shown in FIG. 16, the controller 8 specifies evaluated values of the Y-axis coordinate component of the centroid of the EUV light 277 that are stored in association with the reference scan points arrayed along the Y-axis with respect to the reference scan point B.

Then, as shown by the solid line in FIG. 17, the controller 8 obtains a distribution of the evaluated value of the centroid of the EUV light 277 in the direction along the X-axis with respect to the reference scan point B, from the evaluated values specified as shown in FIG. 15. In addition, as shown by the solid line in FIG. 18, the controller 8 obtains a distribution of the evaluated value of the centroid of the EUV light 277 in the direction along the Y-axis with respect to the reference scan point B, from the evaluated values specified as shown in FIG. 16.

Similarly to the first embodiment, as shown by the broken lines in FIG. 17 and FIG. 18, the controller 8 according to the second embodiment performs the fitting of the distributions of the evaluated value of the centroid of the EUV light 277, for cubic functions. Then, the controller 8 determines that the targeted centroid is a position corresponding to inflection points in cubic curves that are shown by the cubic functions obtained by the fitting.

Alternatively, similarly to the first embodiment, the controller 8 may perform the fitting of the distributions of the evaluated value of the centroid of the EUV light 277, for linear functions. Then, the controller 8 may determine that the targeted centroid is a position corresponding to middle points in line segments that are shown by the linear functions obtained by the fitting.

Alternatively, similarly to the first embodiment, the controller 8 may specify the maximum values and minimum values in the distributions of the evaluated value of the centroid of the EUV light 277. Then, the controller 8 may determine that the targeted centroid is a position corresponding to the respective average values of the specified maximum values and minimum values.

The other operation of the EUV light generating apparatus 1 of the second embodiment is the same as that of the EUV light generating apparatus 1 of the first embodiment.

Similarly to the first embodiment, the EUV light generating apparatus 1 of the second embodiment can calibrate the targeted centroid of the centroid of the EUV light 277 whenever the EUV light centroid control is executed, and can constantly execute appropriate EUV light centroid control.

As a result, similarly to the first embodiment, the EUV light generating apparatus 1 of the second embodiment can suppress the shooting mismatch, and can suppress the deterioration of the properties of the EUV light 277.

5. Third Embodiment

An EUV light generating apparatus 1 of a third embodiment will be described with use of FIG. 19 and FIG. 20.

In the EUV light generating apparatus 1 of the third embodiment, a plurality of pulsed laser light beams 31 are applied to one target 27 supplied to the plasma generation region R1. Therefore, a laser apparatus 3 according to the third embodiment has a different configuration from the laser apparatus 3 according to the first or second embodiment.

Furthermore, the EUV light generating apparatus 1 of the third embodiment is different from the EUV light generating apparatus 1 of the first or second embodiment, in the configurations of the laser light delivery optical system 33 and the application position adjusting unit 7, and has a configuration in which a delay circuit 81 is added.

Further, the EUV light generating apparatus 1 of the third embodiment is different from the EUV light generating apparatus 1 of the first or second embodiment, in the operation of the controller 8 about the calibration process for the targeted centroid.

In the configuration and operation of the EUV light generating apparatus 1 of the third embodiment, descriptions for the same configuration and operation as those of the EUV light generating apparatus 1 of the first or second embodiment are omitted.

[5.1 Configuration]

Figure 19:
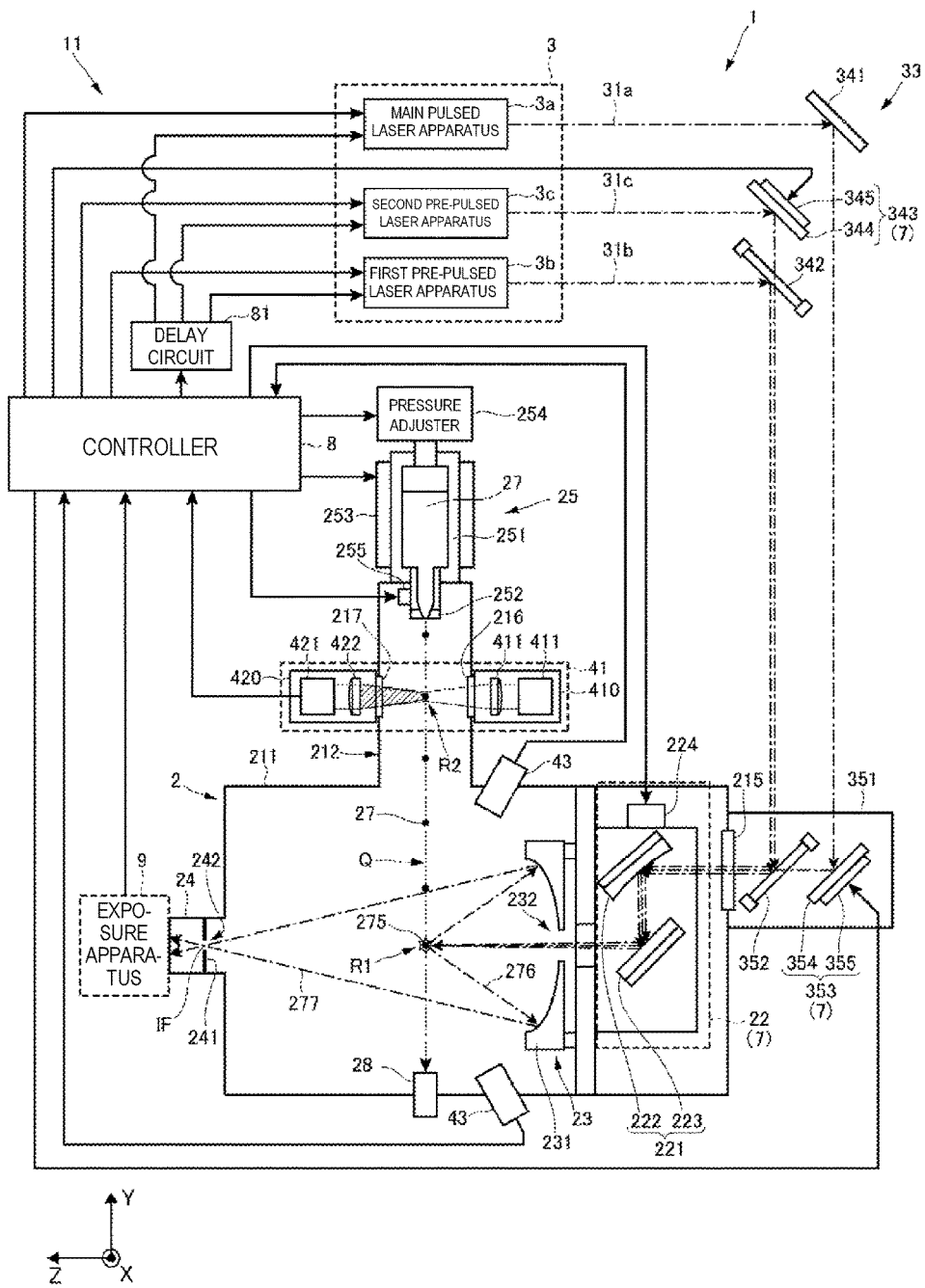
FIG. 19 shows a diagram for describing the configuration of an EUV light generating system including an EUV light generating apparatus of a third embodiment.

FIG. 19 shows a diagram for describing the configuration of an EUV light generating system 11 including the EUV light generating apparatus 1 of the third embodiment.

The laser apparatus 3 according to the third embodiment outputs a plurality of pulsed laser light beams, for applying the pulsed laser light beams to one target 27 supplied to the plasma generation region R1. As the pulsed laser light beams, for example, the laser apparatus 3 outputs three pulsed laser light beams of a first pre-pulsed laser light 31*b*, a second pre-pulsed laser light 31*c*, and a main pulsed laser light 31*a*, in this order.

The laser apparatus 3 includes a main pulsed laser apparatus 3*a*, a first pre-pulsed laser apparatus 3*b*, and a second pre-pulsed laser apparatus 3*c*.

The main pulsed laser apparatus 3a outputs the main pulsed laser light 31a. The main pulsed laser apparatus 3a is a gas laser apparatus such as a $CO_2$ laser apparatus.

The main pulsed laser light 31a is applied to the target 27 for generating the plasma 275 and generating the EUV light 277.

The first and second pre-pulsed laser apparatuses 3b, 3c output the first pre-pulsed laser light 31b and the second pre-pulsed laser light 31c, respectively. Each of the first and second pre-pulsed laser apparatuses 3b, 3c is a solid-state laser apparatus such as a YAG laser apparatus.

Each of the first pre-pulsed laser light 31b and the second pre-pulsed laser light 31c is applied to the target 27 at a stage before the main pulsed laser light 31a is applied to the target 27.

The wavelengths of the first pre-pulsed laser light 31b and the second pre-pulsed laser light 31c may be different from each other.

The first pre-pulsed laser light 31b, the second pre-pulsed laser light 31c, and the main pulsed laser light 31a are also collectively referred to as the pulsed laser light 31.

A laser light delivery optical system 33 according to the third embodiment includes a high reflectance mirror 341, a mirror 342, a first mirror optical system 343, and a beam combiner 351.

The high reflectance mirror 341 reflects the main pulsed laser light 31a output from the main pulsed laser apparatus 3a, toward the beam combiner 351.

The mirror 342 reflects the first pre-pulsed laser light 31b output from the first pre-pulsed laser apparatus 3b, toward the beam combiner 351. In addition, the mirror 342 causes the second pre-pulsed laser light 31c reflected by the first mirror optical system 343 to pass therethrough toward the beam combiner 351.

The first mirror optical system 343 introduces the second pre-pulsed laser light 31c output from the second pre-pulsed laser apparatus 3c, into the beam combiner 351, along roughly the same optical path axis as that of the first pre-pulsed laser light 31b.

The first mirror optical system 343 is disposed on an optical path of the second pre-pulsed laser light 31c before the second pre-pulsed laser light 31c enters the laser light focusing optical system 22.

The first mirror optical system 343 includes a high reflectance mirror 344 and a stage 345.

The high reflectance mirror 344 reflects the second pre-pulsed laser light 31c output from the second pre-pulsed laser apparatus 3c, toward the beam combiner 351, through the mirror 342.

The high reflectance mirror 344 is mounted on the stage 345.

The stage 345 is a mechanism that adjusts at least one of the position and attitude of the high reflectance mirror 344. The stage 345 adjusts the position and attitude of the high reflectance mirror 344, such that the optical path axis of the second pre-pulsed laser light 31c reflected by the high reflectance mirror 344 is roughly the same as the optical path axis of the first pre-pulsed laser light 31b reflected by the mirror 342.

The drive of the stage 345 is controlled by the controller 8.

The beam combiner 351 combines the first pre-pulsed laser light 31b, the second pre-pulsed laser light 31c, and the main pulsed laser light 31a on roughly the same optical path axis, and introduces the combined light into the chamber 2.

The beam combiner 351 includes a dichroic mirror 352 and a second mirror optical system 353.

The dichroic mirror 352 reflects the first pre-pulsed laser light 31b reflected by the mirror 342 and the second pre-pulsed laser light 31c having passed through the mirror 342, toward the window 215. The dichroic mirror 352 causes the main pulsed laser light 31a reflected by the second mirror optical system 353 to pass therethrough toward the window 215.

The second mirror optical system 353 introduces the main pulsed laser light 31a reflected by the high reflectance mirror 341, into the chamber 2, along roughly the same optical path axis as those of the first pre-pulsed laser light 31b and the second pre-pulsed laser light 31c reflected by the dichroic mirror 352.

The second mirror optical system 353 is disposed on an optical path of the main pulsed laser light 31a before the main pulsed laser light 31a enters the laser light focusing optical system 22.

The second mirror optical system 353 includes a high reflectance mirror 354 and a stage 355.

The high reflectance mirror 354 reflects the main pulsed laser light 31a reflected by the high reflectance mirror 341, toward the window 215, through the dichroic mirror 352.

The high reflectance mirror 354 is mounted on the stage 355.

The stage 355 is a mechanism that adjusts at least one of the position and attitude of the high reflectance mirror 354. The stage 355 adjusts the position and attitude of the high reflectance mirror 354, such that the optical path axis of the main pulsed laser light 31a reflected by the high reflectance mirror 354 is roughly the same as the optical path axis of the first pre-pulsed laser light 31b reflected by the dichroic mirror 352.

The drive of the stage 355 is controlled by the controller 8.

Similarly to the first embodiment, an application position adjusting unit 7 according to the third embodiment is configured using the laser light focusing optical system 22. Alternatively, the application position adjusting unit 7 is configured using the first and second mirror optical systems 343, 353. Alternatively, the application position adjusting unit 7 is configured using the first and second mirror optical systems 343, 353 and the laser light focusing optical system 22.

The delay circuit 81 according to the third embodiment is a circuit that adjusts the output timing of the pulsed laser light 31 from the laser apparatus 3, according to a delay time set by the controller 8.

The other configuration of the EUV light generating apparatus 1 of the third embodiment is the same as that of the EUV light generating apparatus 1 of the first or second embodiment.

[5.2 Operation]

The operation of the EUV light generating apparatus 1 of the third embodiment will be described.

First, the operation of the controller 8 that controls the operation of the laser apparatus 3 according to the third embodiment and the operation of the delay circuit 81 will be described.

The controller 8 according to the third embodiment sets delay times Td1 to Td3 in the delay circuit 81.

The delay time Td1 is a time for making the timing when the first pre-pulsed laser light 31b is focused on the plasma generation region R1 roughly coincide with the timing when the target 27 is supplied to the plasma generation region R1.

The delay time Td2 is a time for making the timing when the second pre-pulsed laser light 31c is focused on the plasma generation region R1 roughly coincide with the timing when the target 27 appropriately diffuses after the first pre-pulsed laser light 31b is applied.

The delay time Td3 is a time for making the timing when the main pulsed laser light 31a is focused on the plasma generation region R1 roughly coincide with the timing when the target 27 appropriately diffuses after the second pre-pulsed laser light 31c is applied.

The controller 8 transmits a target detection signal generated at the timing of the passage through the target detection region R2, to the delay circuit 81, with no change.

The delay circuit 81 transmits a first trigger signal that triggers the output of the first pre-pulsed laser light 31b, to the first pre-pulsed laser apparatus 3b, at a timing delayed by the delay time Td1 from the timing when the delay circuit 81 receives the target detection signal. That is, the delay circuit 81 causes the first pre-pulsed laser apparatus 3b to output the first pre-pulsed laser light 31b, at a timing resulting from adding the delay time Td1 to the timing of the passage through the target detection region R2.

Thereby, the first pre-pulsed laser light 31b output from the first pre-pulsed laser apparatus 3b is applied to the target 27 supplied to the plasma generation region R1. The target 27 to which the first pre-pulsed laser light 31b has been applied becomes a state where fine particles such as micro droplets and clusters diffuse in the form of a mist.

Similarly to the first pre-pulsed laser light 31b, the delay circuit 81 causes the second pre-pulsed laser apparatus 3c to output the second pre-pulsed laser light 31c, at a timing resulting from adding the delay time Td2 to the timing of the passage through the target detection region R2.

Thereby, the second pre-pulsed laser light 31c output from the second pre-pulsed laser apparatus 3c is applied to the target 27 to which the first pre-pulsed laser light 31b has been applied and that has appropriately diffused. The target 27 to which the second pre-pulsed laser light 31c has been applied becomes a state where the target 27 has diffused while containing finer particles and vapor of the target 27. The target 27 to which the second pre-pulsed laser light 31c has been applied may be a state where a part of the target 27 has become plasma and the target 27 contains pre-plasma containing ions or neutral particles.

Similarly to the first pre-pulsed laser light 31b and the second pre-pulsed laser light 31c, the delay circuit 81 causes the main pulsed laser apparatus 3a to output the main pulsed laser light 31a, at a timing resulting from adding the delay time Td3 to the timing of the passage through the target detection region R2.

Thereby, the main pulsed laser light 31a output from the main pulsed laser apparatus 3a is applied to the target 27 to which the second pre-pulsed laser light 31c has been applied and that has appropriately diffused. The target to which the main pulsed laser light 31a has been applied generates plasma, and radiates the radiation light 276 including the EUV light 277.

The application of the main pulsed laser light 31a to the target 27 to which the second pre-pulsed laser light 31c has been applied can increase the generation efficiency of the EUV light 277, compared to the application of the main pulsed laser light 31a to the target 27 supplied to the plasma generation region R1.

Subsequently, a calibration process for the targeted centroid that is executed by the controller 8 according to the third embodiment will be described with use of FIG. 20.

Figure 20:
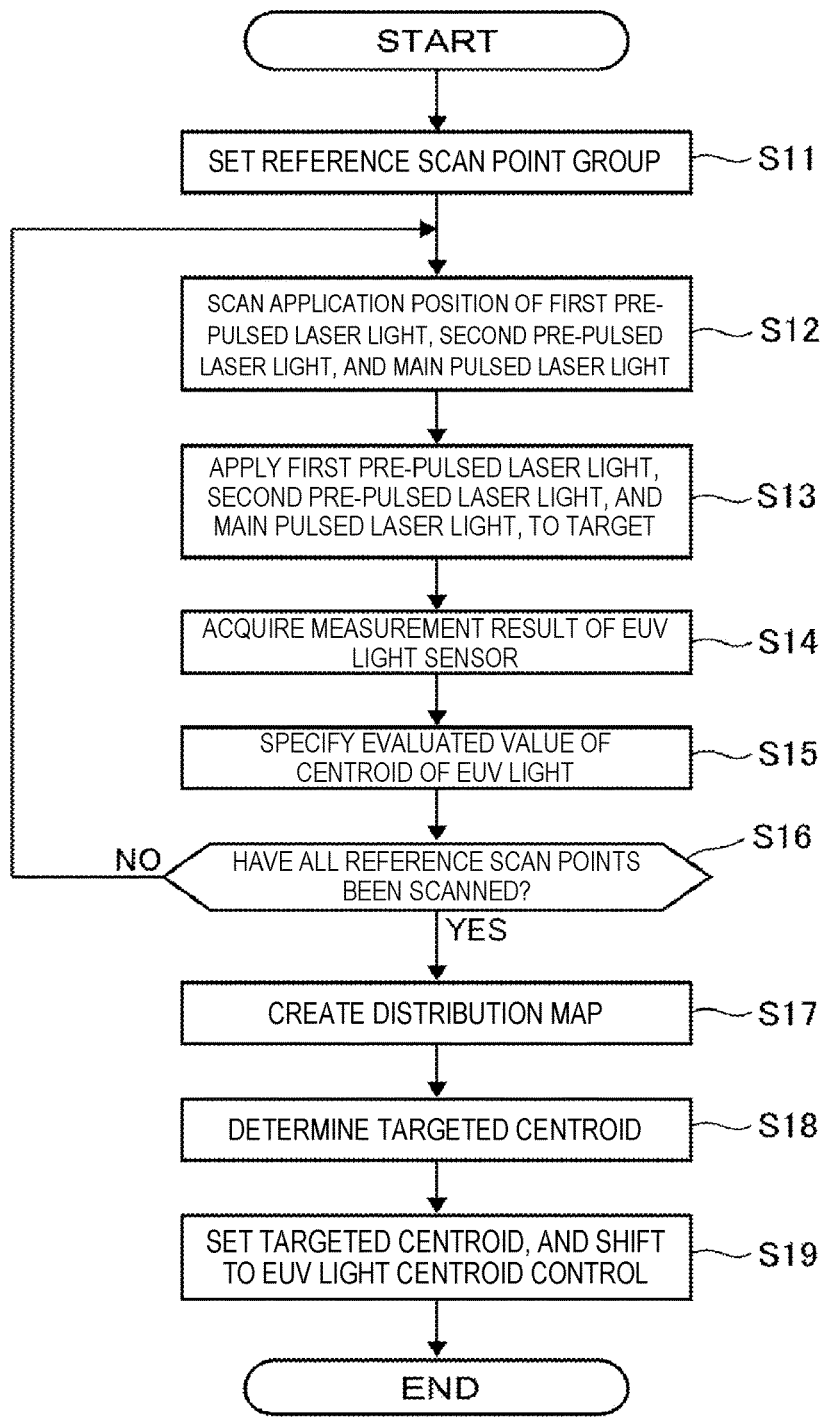
FIG. 20 shows a flowchart for describing a calibration process for the targeted centroid that is executed by a controller according to a third embodiment.

FIG. 20 shows a flowchart for describing the calibration process for the targeted centroid that is executed by the controller 8 according to the third embodiment.

In step S11, the controller 8 executes the same process as step S1 shown in FIG. 4.

In step S12, the controller 8 controls the application position adjusting unit 7, such that the application position of the first pre-pulsed laser light 31b, the second pre-pulsed laser light 31c, and the main pulsed laser light 31a is scanned in accordance with the set reference scan point group.

Specifically, the controller 8 controls the laser light focusing optical system 22 such that the application position of the first pre-pulsed laser light 31b, the second pre-pulsed laser light 31c, and the main pulsed laser light 31a is scanned. On this occasion, in addition to the laser light focusing optical system 22, the controller 8 may control the first and second mirror optical systems 343, 353.

In step S13, the controller 8 transmits the first to third trigger signals to the first pre-pulsed laser apparatus 3b, the second pre-pulsed laser apparatus 3c, and the main pulsed laser apparatus 3a, respectively, and applies the first pre-pulsed laser light 31b, the second pre-pulsed laser light 31c, and the main pulsed laser light 31a, to the target 27.

In steps S14 to S19, the controller 8 executes the same processes as steps S4 to S9 shown in FIG. 4.

The other operation of the EUV light generating apparatus 1 of the third embodiment is the same as that of the EUV light generating apparatus 1 of the first or second embodiment.

[5.3 Effect]

Even though the pulsed laser light 31 includes the plurality of pulsed laser light beams, the EUV light generating apparatus 1 of the third embodiment can calibrate the targeted centroid of the centroid of the EUV light 277, and can constantly execute appropriate EUV light centroid control, similarly to the first or second embodiment.

As a result, similarly to the first or second embodiment, the EUV light generating apparatus 1 of the third embodiment can suppress the shooting mismatch, and therefore, can suppress the deterioration of the properties of the EUV light 277.

6. Fourth Embodiment

An EUV light generating apparatus 1 of a fourth embodiment will be described with use of FIG. 21.

The EUV light generating apparatus 1 of the fourth embodiment has the same configuration as the EUV light generating apparatus 1 of the first, second or third embodiment.

The EUV light generating apparatus 1 of the fourth embodiment is different from the EUV light generating apparatus 1 of the first, second or third embodiment, in the operation of the controller 8 about the calibration process for the targeted centroid.

In the configuration and operation of the EUV light generating apparatus 1 of the fourth embodiment, descriptions for the same configuration and operation of the EUV light generating apparatus 1 of the first, second or third embodiment are omitted.

Similarly to the first, second or third embodiment, a controller 8 according to the fourth embodiment executes the EUV light centroid control.

The controller 8 according to the fourth embodiment executes the calibration process for the targeted centroid, when a predetermined event has occurred. That is, the time when the controller 8 executes the calibration process for the targeted centroid is the time when a predetermined event has occurred.

The predetermined event is at least one of an event that the EUV light generating apparatus 1 is activated, an event that a predetermined number of pulses of EUV light 277 has been generated, an event that the properties of the EUV light 277 have deteriorated, and an event that a predetermined time has elapsed since the activation of the EUV light generating apparatus 1.

The predetermined number of pulses is the number of pulses that are included in a range of 0.5 Bpls (Billion pulse) or more and 5 Bpls or less, for example. The predetermined number of pulses is 0.5 Bpls, for example. The predetermined time is one day, for example. As described above, the properties of the EUV light 277 include at least one of the energy of the EUV light 277 and the variation in the energy of the EUV light 277.

Figure 21:
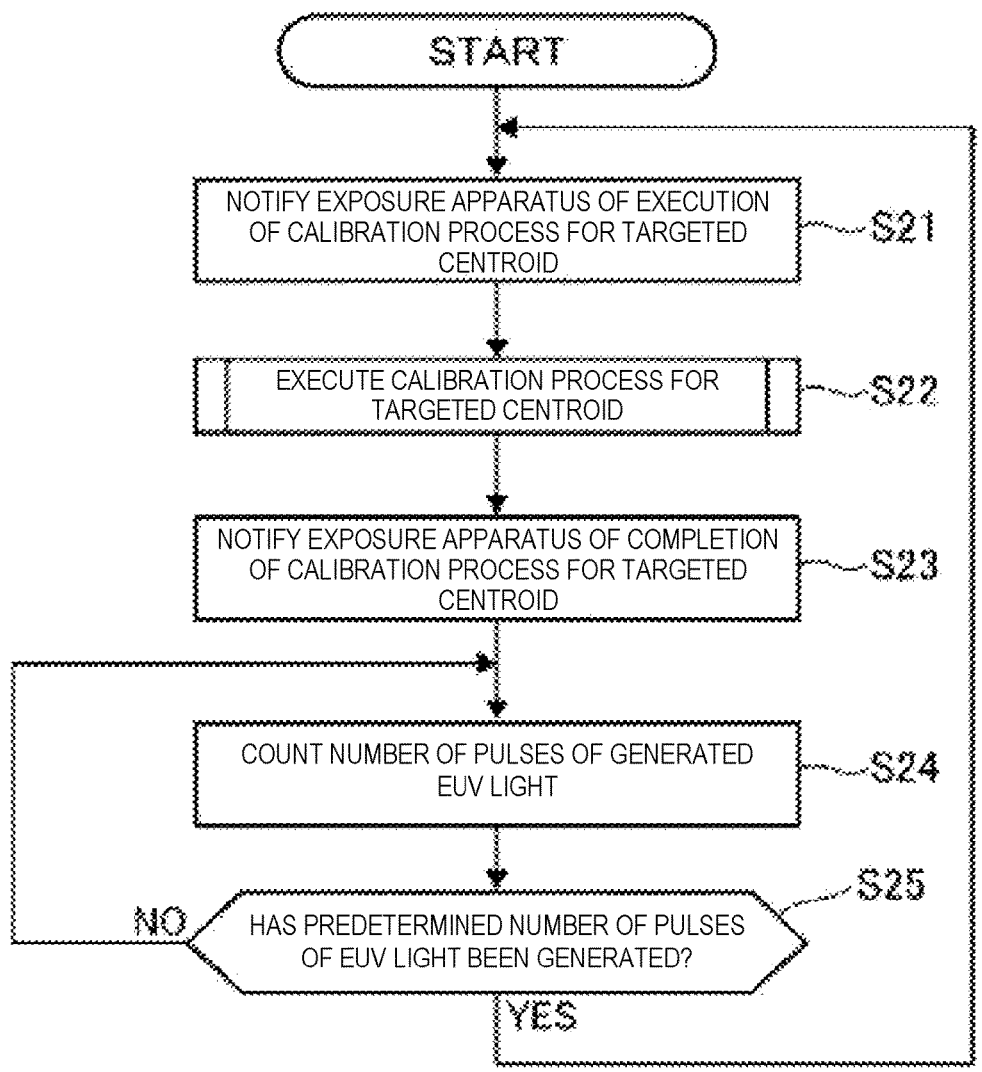
FIG. 21 shows a flowchart for describing a time when a controller of a fourth embodiment executes the calibration process for the targeted centroid.

FIG. 21 shows a flowchart for describing the time when the controller 8 according to the fourth embodiment executes the calibration process for the targeted centroid.

FIG. 21 representatively shows that the controller 8 executes the calibration process for the targeted centroid at the time of the occurrence of two events of the above-described predetermined events, that is, at the time of the occurrence of the event that the EUV light generating apparatus 1 is activated and the event that the predetermined number of pulses of EUV light 277 has been generated.

When the EUV light generating apparatus 1 is activated, the controller 8 performs the following processes.

In step S21, the controller 8 notifies the exposure apparatus 9 of the execution of the calibration process for the targeted centroid.

In step S22, the controller 8 executes the calibration process for the targeted centroid.

The content of the calibration process for the targeted centroid is the same as the calibration process according to the first, second or third embodiment.

That is, the controller 8 scans the application position of the pulsed laser light 31 in accordance with a plurality of reference scan points that are mutually different in position, and acquires the measurement results of the EUV light sensor 43 for the reference scan points. Subsequently, the controller 8 specifies the evaluated values of the centroid of the EUV light 277 for the reference scan points, from the acquired measurement results of the EUV light sensor 43. Subsequently, the controller 8 calibrates the targeted centroid of the centroid of the EUV light 277, based on the acquired measurement results of the EUV light sensor 43 and the specified evaluated values of the centroid.

In step S23, the controller 8 notifies the exposure apparatus 9 of the completion of the calibration process for the targeted centroid.

In step S24, the controller 8 counts the number of the pulses of the generated EUV light 277.

The controller 8 counts the number of the pulses of the EUV light 277, for example, by counting the number of times of the generation of the target detection signal. Alternatively, the controller 8 may count the number of the pulses of the EUV light 277, for example, by counting the number of times of the acquisition of the measurement result of the EUV light sensor 43.

In step S25, the controller 8 determines whether or not the predetermined number of pulses of EUV light 277 has been generated.

As described above, the predetermined number of pulses is the number of pulses that are included in the range of 0.5 Bpls (Billion pulse) or more and 5 Bpls or less, for example. The predetermined number of pulses is 0.5 Bpls, for example.

If the predetermined number of pulses of EUV light 277 has not been generated, the controller 8 goes to step S24. On the other hand, if the predetermined number of pulses of EUV light 277 has been generated, the controller 8 goes to step S21.

The controller 8 can execute the calibration process for the targeted centroid similarly to FIG. 21, also when another event of the above predetermined events has occurred.

For example, in the case of executing the calibration process for the targeted centroid when the properties of the EUV light 277 have deteriorated, the controller 8 executes a process of acquiring the measurement result of the EUV light sensor 43, in step S24. Then, the controller 8 executes a process of determining whether or not at least one of the energy of the EUV light 277 and the variation in the energy of the EUV light 277 has deviated from the permissible range, in step S25.

In the case of executing the calibration process for the targeted centroid when a predetermined time has elapsed since the activation of the EUV light generating apparatus 1, the controller 8 executes a process of counting the elapsed time since the activation of the EUV light generating apparatus 1, in step S24. Then, the controller 8 executes a process of determining whether or not the elapsed time has reached the predetermined time, in step S25.

The other operation of the EUV light generating apparatus 1 of the fourth embodiment is the same as that of the EUV light generating apparatus 1 of the first, second or third embodiment.

Similarly to the first, second or third embodiment, the EUV light generating apparatus 1 of the fourth embodiment can calibrate the targeted centroid of the centroid of the EUV light 277, and can constantly execute appropriate EUV light centroid control.

As a result, similarly to the first, second or third embodiment, the EUV light generating apparatus 1 of the fourth embodiment can suppress the shooting mismatch, and therefore, can suppress the deterioration of the properties of the EUV light 277.

7. Fifth Embodiment

Next, an EUV light generating apparatus 1 of a fifth embodiment will be described with use of FIG. 22 to FIG. 31. In an EUV light generating apparatus 1 of the fifth embodiment and EUV light generating apparatuses 1 of a sixth embodiment and a seventh embodiment described later, the burst light emission of the EUV light 277 is performed.

[7.1 Configuration]

In the EUV light generating apparatus 1 of the fifth embodiment, for the burst light emission of the EUV light 277, a laser apparatus that can generate the pulsed laser light 31 at a predetermined high frequency is used as the laser apparatus 3 shown in FIG. 1. Further, in the EUV light generating apparatus 1 of the fifth embodiment, the process for obtaining the centroid of the EUV light 277 and the calibration process for the targeted centroid are different from the corresponding processes in the first to fourth embodiments. The controller 8 has a configuration allowing these different processes to be performed. Except the above-described three points, the EUV light generating apparatus 1 of the fifth embodiment may be basically configured in the same way as the EUV light generating apparatus 1 of the first embodiment. Further, in the EUV light generating apparatus 1 of the fifth embodiment and the EUV light generating apparatuses 1 of the sixth embodiment and seventh embodiment described later, a configuration in which a target application with pre-pulses is performed may be applied, similarly to the EUV light generating apparatus 1 of the third embodiment.

[7.2 Operation]

FIG. 22 schematically shows the manner of the burst light emission that is performed in the EUV light generating apparatus 1 of the fifth embodiment and the EUV light generating apparatuses 1 of the sixth embodiment and seventh embodiment described later. As shown in FIG. 22, each burst light emission period shown as "BURST 1", "BURST 2", "BURST 3", ..., is repeated with a predetermined stop period. Vertical lines in each burst light emission period indicate the energy of the EUV light 277 shown in FIG. 1, for example. That is, in each burst light emission period, a set of EUV light 277 that is emitted at a high frequency in pulses is output.

In the fifth embodiment, basically similarly to the processes in the first embodiment, the processes by the controller 8 are performed in accordance with the flowchart shown in FIG. 4, but the processes of some steps are different from the processes in the first embodiment. The different processes will be mainly described below.

In the fifth embodiment, the pulsed laser light 31 is applied to the target 27 such that the reference scan points shown in FIG. 5 are sequentially scanned. For the burst light emission of the EUV light 277, the burst oscillation of the pulsed laser light 31 is performed at a predetermined high frequency. In this way, a plurality of pulsed EUV light beams 277 are emitted for one reference scan point.

The process by the controller 8 will be described below in detail, with reference to FIG. 4. In step S4, the controller 8 acquires the measurement result of the EUV light sensor 43. Specifically, the controller 8 performs the statistical processing of the measured values transmitted from the EUV light sensors 43a to 43c, and acquires energy of a plurality of EUV light beams 277 for each reference scan point. Here, the energy of one EUV light 277 emitted in pulses may be the average value of the measured values transmitted from the EUV light sensors 43a to 43c.

In the embodiment, the controller 8, in step S5, acquires an index indicating the variation in energy among the EUV light beams 277, based on the measurement result of the EUV sensor 43. In more detail, the index is an index indicating the variation in energy about the pulsed EUV light beams 277 for one reference scan point. As an example, the index is EUV energy $3\sigma$ [%] described later.

The EUV energy $3\sigma$ [%] is obtained as follows. For example, in one burst light emission period, the pulsed laser light 31 is oscillated by 10000 pulses. That is, in one burst, the EUV light 277 is oscillated in pulses 10000 times. In step S4, the controller 8 obtains the average value and standard deviation $\sigma$ of the energy of the EUV light 277 during the burst light emission, for each reference scan point. Then, the controller 8 obtains the value of ($3\sigma$/average value)×100 [%] for each burst, from the average value and the standard deviation a, and obtains the average values of that values for ten bursts, as the EUV energy $3\sigma$ [%]. The controller 8 stores the value of the EUV energy $3\sigma$ [%], in association with the reference scan point.

In step S5, the controller 8 specifies the evaluated value of the centroid of the EUV light 277. For specifying the evaluated value, for example, Expression 1 and Expression 2 are calculated, similarly to the first embodiment. Then, the controller 8 specifies the calculated value of Expression 1, as the evaluated value of the X-axis coordinate component of the centroid of the EUV light 277. Further, the controller 8 specifies the calculated value of Expression 2, as the evaluated value of the Y-axis coordinate component of the centroid of the EUV light 277. Then, the controller 8 stores the two specified evaluated values in association with the reference scan point. In step S6, the controller 8 determines whether or not all reference scan points included in the set reference scan point group have been scanned. If all reference scan points have not been scanned, the controller 8 goes to step S2, and continues the process. On the other hand, if all reference scan points have been scanned, the controller 8 goes to step S7, and continues the process.

In step S7, the controller 8 creates a distribution map of the value of the EUV energy $3\sigma$ [%] shown in FIG. 23, based on values of the EUV energy $3\sigma$ [%] stored in association with the reference scan points. Furthermore, the controller 8 creates a distribution map shown in FIG. 24, based on calculated values of Expression 1 stored in association with the reference scan points. The distribution map indicates a distribution of the evaluated value of the X-axis coordinate component of the centroid of the EUV light 277. In addition, the controller 8 creates a distribution map shown in FIG. 25, based on the calculated value of Expression 2 stored in association with the reference scan points. The distribution map indicates a distribution of the evaluated value of the Y-axis coordinate component of the centroid of the EUV light 277.

In FIG. 24 and FIG. 25, the values written with X, that is, −21, −14, −7, 0, 7, 14, and 21, indicate X-axis directional distances from a reference position to the reference scan points arrayed in the X-axis direction. Similarly, in FIG. 24 and FIG. 25, the values written with Y, that is, −21, −14, −7, 0, 7, 14, and 21, indicate Y-axis directional distances from the reference position to the reference scan points arrayed in the Y-axis direction. The unit of the distances is μm. The above reference position is a position where the distance is 0.

In step S8, the controller 8 determines the targeted centroid based on the distribution maps created in step S7. A process in which the controller 8 determines the targeted centroid will be described with reference to FIG. 23 to FIG. 30.

The process of step S9 by the controller 8 is performed basically in the same way as the process in the first embodiment.

Figure 28:
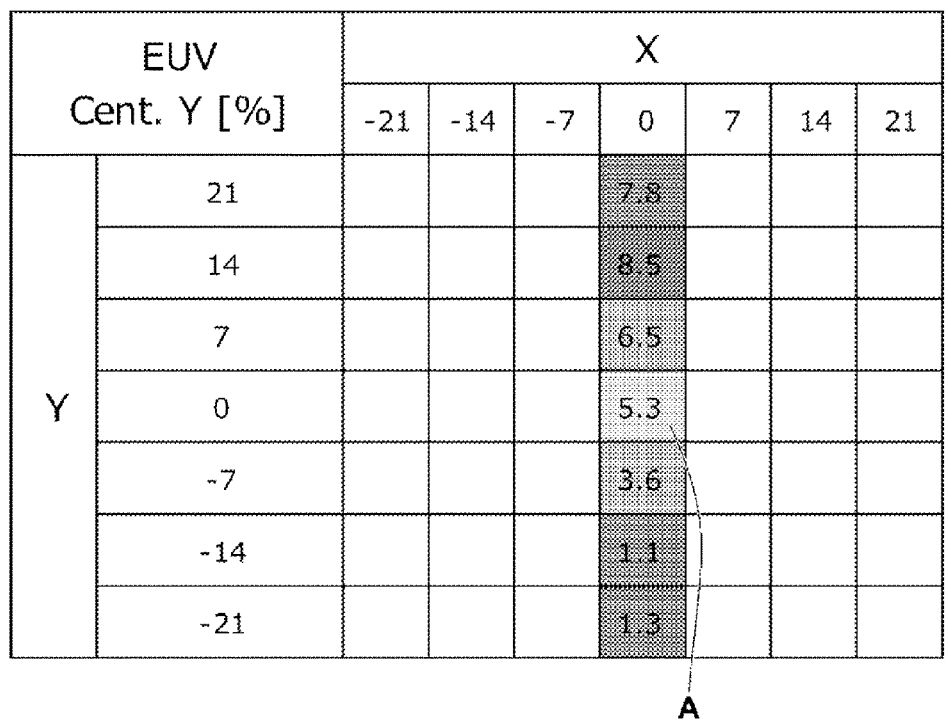
FIG. 28 shows a plurality of reference scan points that are arrayed along the Y-axis with respect to the reference scan point A shown in FIG. 23 and evaluated values of the Y-axis coordinate component of the centroid of the EUV light that are stored in association with the reference scan points.

Next, the process in which the controller 8 determines the targeted centroid in step S8 of FIG. 4 will be described mainly with reference to FIG. 23 to FIG. 30. FIG. 26 shows a plurality of reference scan points that are arrayed along the X-axis and the Y-axis with respect to a reference scan point A shown in FIG. 23 and values of the EUV energy $3\sigma$ [%] that are stored in association with the reference scan points respectively. FIG. 27 shows a plurality of reference scan points that are arrayed along the X-axis with respect to the reference scan point A shown in FIG. 23 and evaluated values of the X-axis coordinate component of the centroid of the EUV light 277 that are stored in association with the reference scan points respectively. FIG. 28 shows a plurality of reference scan points that are arrayed along the Y-axis with respect to the reference scan point A shown in FIG. 23 and evaluated values of the Y-axis coordinate component of the centroid of the EUV light 277 that are stored in association with the reference scan points respectively.

Figure 29:
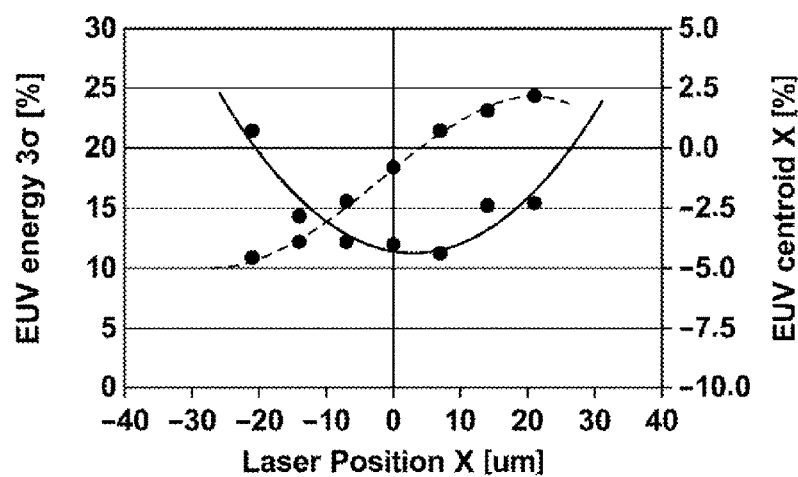
FIG. 29 shows examples of curves respectively approximated from a distribution of the variation index of the EUV light energy and a distribution of the evaluated value of the centroid of the EUV light in the direction along the X-axis.
Figure 30:
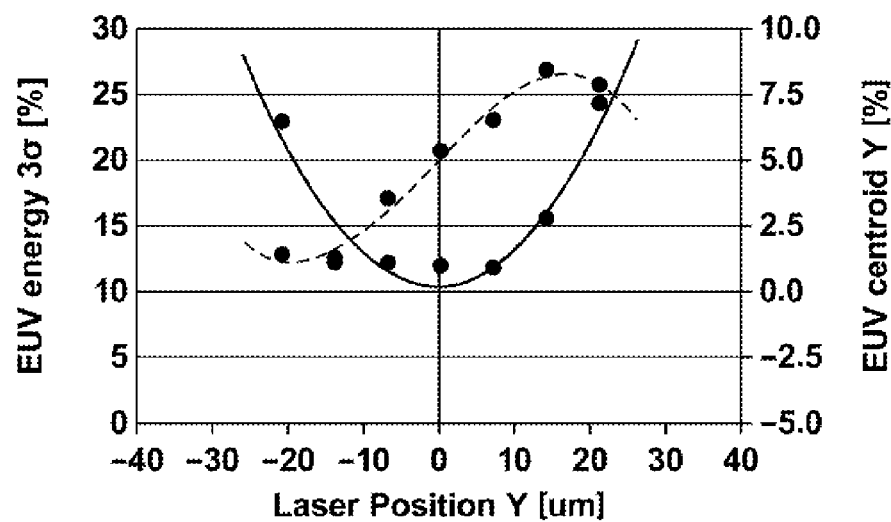
FIG. 30 shows examples of curves respectively approximated from a distribution of the variation index of the EUV light energy and a distribution of the evaluated value of the centroid of the EUV light in the direction along the Y-axis.

FIG. 29 shows a distribution of the value of the EUV energy $3\sigma$ [%] and a distribution of the evaluated value of the centroid in the direction along the X-axis. The evaluated value is the calculation result of Expression 1. FIG. 30 shows a distribution of the value of the EUV energy $3\sigma$ [%]

and a distribution of the evaluated value of the centroid in the direction along the Y-axis. The evaluated value is the calculation result of Expression 2. In each of FIG. 29 and FIG. 30, the solid line shows a curve obtained by the fitting of the distribution of the value of the EUV energy 3σ [%] using a two-order polynomial approximation, and the broken line shows a curve obtained by the fitting of the distribution of the evaluated value of the centroid using a three-order polynomial approximation.

The controller 8 determines the targeted centroid by performing the following process based on the distribution maps created in step S7 of FIG. 4. That is, as shown in FIG. 23, the controller 8 specifies a range K of reference scan points in which the values of the EUV energy 3σ [%] acquired for the reference scan points included in the set reference scan point group are in a predetermined range. The range K is a range in which the value of the EUV energy 3σ [%] is in the bottom 10%, for example. In more detail, the range K is a range in which the value of the EUV energy 3σ [%] is more than or equal to the minimum value and less than or equal to a value that is more than the minimum value by 10%.

The controller 8 obtains the reference scan point A shown in FIG. 23, based on the range K, as described below. That is, the controller 8 obtains a geometric centroid resulting from weighting the values of the EUV energy 3σ [%] stored in association with the reference scan points in the specified range K, with the average value of them, and specifies the reference scan point closest to the geometric centroid, as the reference scan point A. Subsequently, as shown in FIG. 26, the controller 8 specifies a plurality of reference scan points arrayed along the X-axis with respect to the specified reference scan point A and a plurality of reference scan points arrayed along the Y-axis with respect to the specified reference scan point A.

Subsequently, as shown in FIG. 27, the controller 8 specifies evaluated values of the centroid of the EUV light 277 that are stored in association with the reference scan points arrayed along the X-axis with respect to the reference scan point A. In addition, as shown in FIG. 28, the controller 8 specifies evaluated values of the centroid of the EUV light 277 that are stored in association with the reference scan points arrayed along the Y-axis with respect to the reference scan point A.

Subsequently, the controller 8 obtains a distribution of the evaluated value specified in FIG. 27, that is, a distribution of the evaluated value of the centroid of the EUV light 277 in the direction along the X-axis with respect to the reference scan point A. The controller 8 performs the fitting of the distribution, using a three-order polynomial approximation. As described above, the cubic curve obtained by the fitting is the curve shown by the broken line in FIG. 29. Furthermore, the controller 8 obtains a distribution of the value of the EUV energy 3σ [%] in the direction along the X-axis with respect to the reference scan point A. The controller 8 performs the fitting of the distribution, using a two-order polynomial approximation. As described above, the quadratic curve obtained by the fitting is the curve shown by the solid line in FIG. 29.

In addition, the controller 8 obtains a distribution of the evaluated value specified in FIG. 28, that is, a distribution of the evaluated value of the centroid of the EUV light 277 in the direction along the Y-axis with respect to the reference scan point A. The controller 8 performs the fitting of the distribution, using a three-order polynomial approximation. As described above, the cubic curve obtained by the fitting is the curve shown by the broken line in FIG. 30. Furthermore, the controller 8 obtains a distribution of the value of the EUV energy 3σ [%] in the direction along the Y-axis with respect to the reference scan point A. The controller 8 performs the fitting of the distribution, using a two-order polynomial approximation. As described above, the quadratic curve obtained by the fitting is the curve shown by the solid line in FIG. 30.

As shown by the broken lines in FIG. 29 and FIG. 30, each of the distributions of the evaluated value of the centroid of the EUV light 277 can linearly change at the reference scan point A and at positions near the reference scan point A, and can non-linearly change at positions away from the reference scan point A. At the portion where the distribution of the evaluated value non-linearly changes, it is thought that the application position of the pulsed laser light 31 deviates from the appropriate position and is an application position where a relatively great shooting mismatch may occur.

Figure 31:
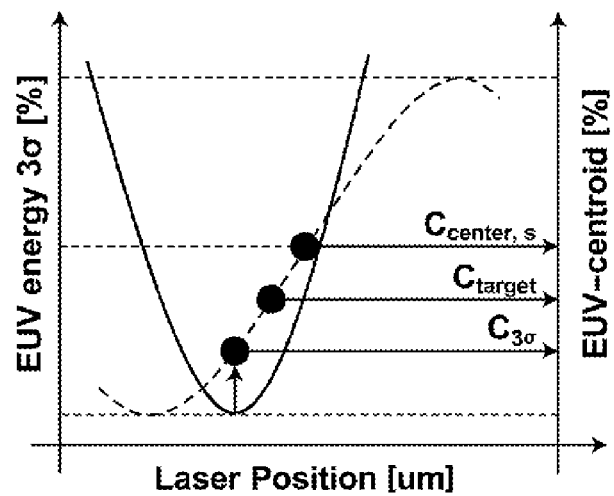
FIG. 31 shows a diagram for describing a calibration process for the targeted centroid in the fifth embodiment.

Hence, the controller 8 determines the targeted centroid, based on inflection points in the cubic curves shown by the broken lines in FIG. 29 and FIG. 30. In the embodiment, the controller 8 determines the targeted centroid, based on not only the inflection points but also the distributions of the value of the EUV energy 3σ [%]. FIG. 31 is a diagram for describing the process for determining the targeted centroid. In FIG. 31, as typical curves, the cubic curve and quadratic curve in FIG. 29 and FIG. 30 are schematically shown by the broken line and the solid line, respectively.

The controller 8 determines the targeted centroid as follows. That is, the controller 8 obtains an EUV centroid $C_{center,s}$ corresponding to the inflection point in the cubic curve shown in FIG. 31. As the EUV centroid $C_{center,s}$, a middle point between the maximum value and minimum value of the measured value of the EUV centroid may be selected, or a middle point in the measurement range of a primary approximation may be selected. Further, from the quadratic curve shown in FIG. 31, the controller 8 obtains an EUV centroid $C_{3\sigma}$ corresponding to the laser application position that is the apex of the quadratic curve. The EUV centroid $C_{3\sigma}$ is equivalent to the evaluated value of the centroid corresponding to a point on the cubic curve at the laser application position that is the above apex. Then, the controller 8 obtains $C_{target}$ from Expression 3 described below, as the targeted centroid. The controller 8 performs the process for obtaining $C_{target}$, for example, in step S8 of FIG. 4.

$$C_{target} = \frac{1}{k}(k_{center,s}C_{center,s} + k_{3\sigma}C_{3\sigma}) \quad \text{[Expression 3]}$$
$$k = k_{center,s} + k_{3\sigma}$$

Here, both $k_{center,s}$ and $k_{3\sigma}$ are 1, for example, and in this case, k=2 is satisfied.

The process for obtaining $C_{target}$ from Expression 3 is performed based on the distribution of the evaluated value of the centroid and the distribution of the value of the EUV energy 3σ [%] in the X-axis direction shown in FIG. 29. Further, the process for obtaining $C_{target}$ is similarly performed based on the distribution of the evaluated value of the centroid and the distribution of the value of the EUV energy 3σ [%] in the Y-axis direction shown in FIG. 30.

For example, in step S9 of FIG. 4, the controller 8 sets the targeted centroid determined in step S8, as a new targeted centroid. Then, the controller 8 shifts to the EUV light centroid control. The controller 8 sets the targeted application position of the application position of the pulsed laser light 31, such that the centroid of the EUV light 277 becomes the new targeted centroid. Then, the controller 8 controls the application position adjusting unit 7 according to the set targeted application position.

Specifically, the controller 8 specifies the deviation between the current application position of the pulsed laser light 31 and the new targeted application position of the pulsed laser light 31 corresponding to the new targeted centroid. Then, the controller 8 specifies the deviation between the current focusing position of the pulsed laser light 31 and a new targeted focusing position of the pulsed laser light 31 corresponding to the new targeted application position. Next, the controller 8 determines the adjustment amount of the application position adjusting unit 7 such that the deviation of the focusing position of the pulsed laser light 31 is reduced. In this way, the controller 8 can calibrate the targeted centroid, whenever the EUV light centroid control is executed.

[7.3 Effect]

As described above, the controller 8 according to the fifth embodiment can calibrate the targeted centroid of the centroid of the EUV light 277, whenever the EUV light centroid control is executed. Effects to be obtained from this are basically the same as the effects in the first embodiment. In addition, in the fifth embodiment, the controller 8 calibrates the targeted centroid also in consideration of the value of the EUV centroid $C_{3\sigma}$ r5 lose to the minimum value of the value of the EUV energy $3\sigma$ [%] that is an index indicating the variation among the EUV light beams 277. A smaller value of the above index shows that the EUV light beams 277 are emitted more stably. Hence, by calibrating the targeted centroid also in consideration of the value of the EUV centroid $C_{3\sigma}$, it is possible to make the output of the EUV light beams 277 during the burst light emission more stable.

Figure 32:
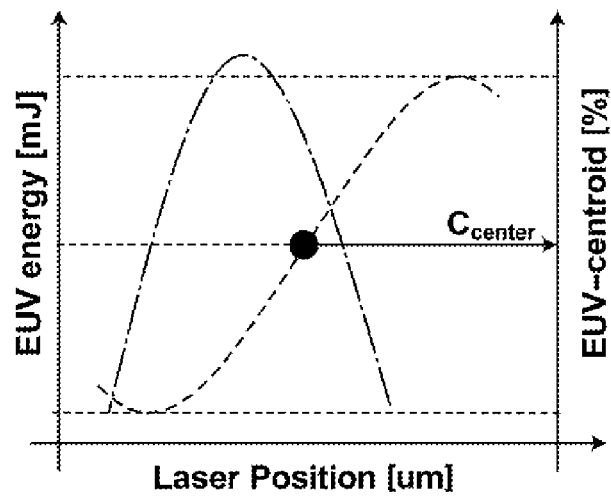
FIG. 32 shows a diagram for describing a calibration process for the targeted centroid in the first embodiment.

In the first embodiment, as schematically shown in FIG. 32, $C_{target}$ is obtained from Expression 4 described below, as the targeted centroid. Here, the quadratic curve shown by the chain line in FIG. 32 is obtained by performing the fitting of the energy distribution of the EUV light 277 shown in FIG. 12 or FIG. 13 using a two-order polynomial approximation. Further, the cubic curve shown by the broken line in FIG. 32 is equivalent to the cubic curve shown by the broken line in FIG. 31.

$$C_{target} = k_{center} C_{center} \quad \text{[Expression 4]}$$

Here, the EUV centroid $C_{center}$ corresponds to the EUV centroid $C_{center,s}$ in FIG. 31. For example, $k_{center}$ is 1.

8. Sixth Embodiment

Next, an EUV light generating apparatus 1 of the sixth embodiment will be described with reference to FIG. 33. The EUV light generating apparatus 1 of the sixth embodiment is different from the EUV light generating apparatus 1 of the fifth embodiment, in the method for obtaining $C_{target}$ that is the targeted centroid. A controller 8 of the EUV light generating apparatus 1 of the sixth embodiment has a configuration for obtaining the different $C_{target}$.

Figure 33:
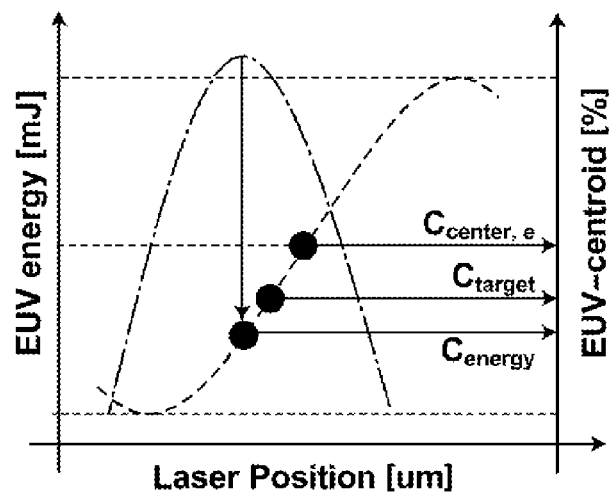
FIG. 33 shows a diagram for describing a calibration process for the targeted centroid in a sixth embodiment.

The quadratic curve shown by the chain line in FIG. 33 is a curve corresponding to the quadratic curve shown by the chain line in FIG. 32. The cubic curve shown by the broken line in FIG. 33 corresponds to the cubic curve shown by the broken line in FIG. 31 and FIG. 32. An EUV centroid $C_{center,e}$ shown in FIG. 33 is equivalent to the EUV centroid $C_{center,s}$ shown in FIG. 31. In this case also, as the EUV centroid $C_{center,e}$, a middle point between the maximum value and minimum value of the measured value of the EUV centroid may be selected, or a middle point in the measurement range of a primary approximation may be selected. The controller 8 obtains the above quadratic curve by performing the fitting of the energy distribution of the EUV light 277. The energy distribution is obtained, for example, from a centroid point of the values of the top 10% of the energy of the EUV light 277. In this case, for example, the average value of the EUV light 277 for ten bursts is applied as the energy of the EUV light 277. Further, the distribution of the emitting efficiency of the EUV light may be used instead of the energy distribution of the EUV light 277. The emitting efficiency of the EUV light is a ratio of the energy of the EUV light to the energy of the laser light that is applied to the target.

From the quadratic curve obtained as described above, the controller 8 obtains the EUV centroid $C_{energy}$ based on the apex of the quadratic curve. That is, the EUV centroid $C_{energy}$ is a value of the above cubic curve at the pulsed laser application position corresponding to the above apex. Then, the controller 8 obtains $C_{target}$ from Expression 5 described below, as the targeted centroid. The controller 8 performs the process for obtaining $C_{target}$, for example, in step S8 of FIG. 4.

$$C_{target} = \frac{1}{k}(k_{center,e} C_{center,e} + k_{energy} C_{energy}) \quad \text{[Expression 5]}$$

$$k = k_{center,e} + k_{energy}$$

Here, both $k_{center,e}$ and $k_{energy}$ are 1, for example, and in this case, k=2 is satisfied.

Effects in the sixth embodiment are basically the same as the effects in the first embodiment. In addition, in the sixth embodiment, the controller 8 calibrates the targeted centroid also in consideration of the value of the EUV centroid $C_{energy}$. Hence, the burst light emission of the EUV light 277 can be performed at a higher output.

9. Seventh Embodiment

Next, an EUV light generating apparatus 1 of the seventh embodiment will be described with reference to FIG. 34. The EUV light generating apparatus 1 of the seventh embodiment is different from the EUV light generating apparatus 1 of the fifth embodiment, in the method for obtaining $C_{target}$ that is the targeted centroid. A controller 8 of the EUV light generating apparatus 1 of the seventh embodiment has a configuration for obtaining the different $C_{target}$.

Figure 34:
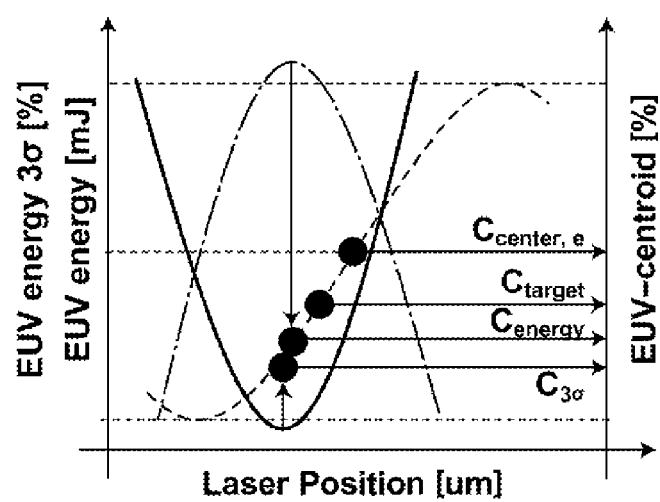
FIG. 34 shows a diagram for describing a calibration process for the targeted centroid in a seventh embodiment.

The quadratic curve shown by the chain line in FIG. 34 corresponds to the quadratic curves shown by the chain line in FIG. 32 and FIG. 33. The cubic curve shown by the broken line in FIG. 34 corresponds to the cubic curves shown by the broken lines in FIG. 31 to FIG. 33. The quadratic curve shown by the solid line in FIG. 34 corresponds to the quadratic curve shown by the solid line in FIG. 31. EUV centroids $C_{center,e}$ and $C_{energy}$ shown in FIG. 34 are equivalent to the EUV centroids $C_{center,e}$ and $C_{energy}$ shown in FIG. 33, respectively. Further, an EUV centroid $C_{3\sigma}$ shown in FIG. 34 is equivalent to the EUV centroid $C_{3\sigma}$ shown in FIG. 31.

The controller 8 obtains $C_{target}$ from Expression 6 described below, as the targeted centroid. The controller 8 performs the process for obtaining $C_{target}$, for example, in step S8 of FIG. 4.

$$C_{target} = \frac{1}{k}(k_{center,s}C_{center,s} +$$

$$k_{center,e}C_{center,e} + k_{3\sigma}C_{3\sigma} + k_{energy}C_{energy})$$

$$k = k_{center,s} + k_{center,e} + k_{3\sigma} + k_{energy}$$

[Expression 6]

Here, all of $k_{center,s}$, $k_{center,e}$, $k_{3\sigma}$, and $k_{energy}$ are 1, for example, and in this case, k=4 is satisfied.

Effects in the seventh embodiment are basically the same as the effects in the first embodiment. In addition, in the seventh embodiment, the controller 8 calibrates the targeted centroid also in consideration of the value of the EUV centroid $C_{3\sigma}$ and the value of the EUV centroid $C_{energy}$. Hence, the output of the burst light emission of the EUV light 277 becomes more stable, and a high output can be achieved.

10. Others

In the above-described embodiments, it is obvious to those in the art that techniques in the embodiments including modifications can be applied to each other.

The above description is intended to be not limitations but just examples. Accordingly, it is obvious to those skilled in the art that the embodiments in the present disclosure can be modified without departing from the accompanying claims.

The terms used in the whole of the present specification and the accompanying claims should be understood as "non-limitative" terms. For example, the term "including" or "included" should be understood as "not limited to the description about the including or included". The term "having" should be understood as "not limited to the description about the having". Further, it should be understood that a modifier "one" described in the present specification and the accompanying claims means "at least one" or "one or more".

What is claimed is:

1. An extreme ultraviolet light generating apparatus comprising:
    a plurality of EUV light sensors configured to measure energy of extreme ultraviolet light from mutually different directions, the extreme ultraviolet light being generated by applying laser light to a target supplied to a predetermined region in a chamber;
    an application position adjusting unit configured to adjust an application position of the laser light to the target supplied to the predetermined region; and
    a controller configured to control the application position adjusting unit such that a centroid of the extreme ultraviolet light becomes a targeted centroid, the centroid of the extreme ultraviolet light being specified from measurement results of the EUV light sensors,
    the controller
    controlling the application position adjusting unit such that the application position is scanned in accordance with a plurality of reference scan points that are mutually different in position, and
    calibrating the targeted centroid based on the measurement results acquired for the reference scan points.

2. The extreme ultraviolet light generating apparatus according to claim 1, wherein
    the controller
    sets a targeted application position of the application position such that the centroid of the extreme ultraviolet light becomes the targeted centroid, and controls the application position adjusting unit according to the set targeted application position.

3. The extreme ultraviolet light generating apparatus according to claim 2, wherein
    the controller calibrates the targeted centroid, based on evaluated values of the centroid for the reference scan points, the evaluated values being specified from the measurement results acquired for the reference scan points.

4. The extreme ultraviolet light generating apparatus according to claim 3, wherein
    the controller calibrates the targeted centroid, based on the evaluated values and an energy variation among extreme ultraviolet light beams generated for the reference scan points.

5. The extreme ultraviolet light generating apparatus according to claim 3, wherein
    the controller calibrates the targeted centroid, based on the evaluated values and energy of extreme ultraviolet light beams generated for the reference scan points.

6. The extreme ultraviolet light generating apparatus according to claim 3, wherein
    the controller calibrates the targeted centroid, based on the evaluated values, energy of extreme ultraviolet light beams generated for the reference scan points, and an energy variation among the extreme ultraviolet light beams generated for the reference scan points.

7. The extreme ultraviolet light generating apparatus according to claim 3, wherein
    the application position adjusting unit includes:
    a focusing mirror configured to focus the laser light on the predetermined region; and
    a manipulator configured to adjust at least one of a position and an attitude of the focusing mirror.

8. The extreme ultraviolet light generating apparatus according to claim 3, wherein
    the plurality of EUV light sensors include at least three EUV light sensors that are disposed at a mutually equal distance from the predetermined region.

9. The extreme ultraviolet light generating apparatus according to claim 3, wherein
    the laser light includes:
    a first pre-pulsed laser light that is applied to the target supplied to the predetermined region;
    a second pre-pulsed laser light that is applied to the target to which the first pre-pulsed laser light has been applied; and
    a main pulsed laser light that is applied to the target to which the second pre-pulsed laser light has been applied.

10. The extreme ultraviolet light generating apparatus according to claim 3, wherein
    the controller controls the application position adjusting unit such that the application position is scanned, and calibrates the targeted centroid, at time of occurrence of at least one event of:
    an event that the extreme ultraviolet light generating apparatus is activated;
    an event that a predetermined number of pulses of the extreme ultraviolet light has been generated;
    an event that at least one of the energy of the extreme ultraviolet light and a variation in the energy deviates from a permissible range; and
    an event that a predetermined time has elapsed since activation of the extreme ultraviolet light generating apparatus.

11. The extreme ultraviolet light generating apparatus according to claim 3, wherein
the controller sets the reference scan points depending on a diameter of the laser light in the predetermined region.

12. The extreme ultraviolet light generating apparatus according to claim 3, wherein
the controller sets the reference scan points to positions arrayed along two axes on a plane, the plane being perpendicular to a traveling direction of the laser light that travels toward the predetermined region and crossing the predetermined region.

13. The extreme ultraviolet light generating apparatus according to claim 12, wherein
the controller
specifies the reference scan point for which the measurement result indicating the maximum energy is acquired, from the measurement results acquired for the reference scan points, and
calibrates the targeted centroid based on the evaluated values for the reference scan points arrayed along one of the two axes with respect to the specified reference scan point and the evaluated values for the reference scan points arrayed along the other of the two axes with respect to the specified reference scan point.

14. The extreme ultraviolet light generating apparatus according to claim 12, wherein
the controller
specifies a range of the reference scan points in which the energy is in a predetermined range, from the measurement results acquired for the reference scan points,
specifies the reference scan point for which the measurement result closest to a weighted average value is acquired, the weighted average value being a weighted average value of the measurement results in the specified range, and
calibrates the targeted centroid based on the evaluated values for the reference scan points arrayed along one of the two axes with respect to the specified reference scan point and the evaluated values for the reference scan points arrayed along the other of the two axes with respect to the specified reference scan point.

15. The extreme ultraviolet light generating apparatus according to claim 14, wherein
the controller
performs fitting of a distribution of the evaluated values in a direction along one of the two axes with respect to the specified reference scan point and fitting of a distribution of the evaluated values in a direction along the other of the two axes with respect to the specified reference scan point, for cubic functions, and
calibrates the targeted centroid by determining that the targeted centroid is a position corresponding to inflection points in cubic curves that are shown by the cubic functions obtained by the fittings.

16. The extreme ultraviolet light generating apparatus according to claim 14, wherein
the controller
performs fitting of a distribution of the evaluated values in a direction along one of the two axes with respect to the specified reference scan point and fitting of a distribution of the evaluated values in a direction along the other of the two axes with respect to the specified reference scan point, for linear functions, and
calibrates the targeted centroid by determining that the targeted centroid is a position corresponding to middle points in line segments that are shown by the linear functions obtained by the fittings.

17. The extreme ultraviolet light generating apparatus according to claim 14, wherein
the controller
specifies a maximum value and a minimum value in a distribution of the evaluated values in a direction along one of the two axes with respect to the specified reference scan point and a maximum value and a minimum value in a distribution of the evaluated values in a direction along the other of the two axes with respect to the specified reference scan point, and
calibrates the targeted centroid by determining that the targeted centroid is a position corresponding to respective average values of the specified maximum values and minimum values.

18. A control method for a centroid of extreme ultraviolet light, the extreme ultraviolet light being generated by applying laser light to a target, the control method comprising:
a first step of scanning an application position of the laser light to the target in accordance with a plurality of reference scan points that are mutually different in position, and acquiring energy of the extreme ultraviolet light for the reference scan points;
a second step of specifying evaluated values of the centroid for the reference scan points, from the energy acquired in the first step; and
a third step of calibrating a targeted centroid of the centroid, based on at least one of the energy acquired in the first step and the evaluated values specified in the second step.

19. The control method for the centroid of the extreme ultraviolet light according to claim 18, wherein
the first to third steps are executed when an extreme ultraviolet light generating apparatus configured to generate the extreme ultraviolet light is activated.

20. The control method for the centroid of the extreme ultraviolet light according to claim 18, wherein
the first to third steps are executed when a predetermined number of pulses of the extreme ultraviolet light has been generated.

21. The control method for the centroid of the extreme ultraviolet light according to claim 18, wherein
the first to third steps are executed when at least one of the energy of the extreme ultraviolet light and a variation in the energy deviates from a permissible range.

22. The control method for the centroid of the extreme ultraviolet light according to claim 18, wherein
the first to third steps are executed when a predetermined time has elapsed since activation of an extreme ultraviolet light generating apparatus configured to generate the extreme ultraviolet light.

23. The control method for the centroid of the extreme ultraviolet light according to claim 18, wherein
a step of calibrating the targeted centroid based on the evaluated values and an energy variation among a plurality of extreme ultraviolet light beams generated for the reference scan points is executed as the third step.

24. The control method for the centroid of the extreme ultraviolet light according to claim 18, wherein
a step of calibrating the targeted centroid based on the evaluated values and the energy is executed as the third step.

25. The control method for the centroid of the extreme ultraviolet light according to claim 18, wherein a step of calibrating the targeted centroid based on the evaluated values, the energy, and an energy variation among extreme ultraviolet light beams generated for the reference scan points is executed as the third step.

* * * * *